(12) United States Patent
Goto

(10) Patent No.: US 10,032,820 B2
(45) Date of Patent: Jul. 24, 2018

(54) IMAGING DEVICE AND MANUFACTURING METHOD OF THE SAME

(71) Applicant: Renesas Electronics Corporation, Tokyo (JP)

(72) Inventor: Yotaro Goto, Hitachinaka (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/189,303

(22) Filed: Jun. 22, 2016

(65) Prior Publication Data

US 2017/0062497 A1    Mar. 2, 2017

(30) Foreign Application Priority Data

Aug. 26, 2015  (JP) ................................. 2015-166804

(51) Int. Cl.
*H01L 27/146* (2006.01)

(52) U.S. Cl.
CPC .... *H01L 27/1463* (2013.01); *H01L 27/14623* (2013.01); *H01L 27/14643* (2013.01); *H01L 27/14685* (2013.01); *H01L 27/14689* (2013.01)

(58) Field of Classification Search
CPC ..................................................... H01L 27/1463
USPC ......................................................... 257/432
See application file for complete search history.

(56) References Cited

U.S. PATENT DOCUMENTS

2012/0199893 A1* 8/2012 Okabe .............. H01L 27/14641
257/291

FOREIGN PATENT DOCUMENTS

JP           2010-16128 A     1/2010

* cited by examiner

*Primary Examiner* — Moazzam Hossain
*Assistant Examiner* — Warren H Kilpatrick
(74) *Attorney, Agent, or Firm* — Sughrue Mion, PLLC

(57) ABSTRACT

An imaging device and a manufacturing method of the imaging device are provided, which can lower the level of a dark current in an optical black pixel without forming a new layer such as a hydrogen diffusion preventing film. Both of an insulating layer over a photodiode arranged over an effective pixel region and an insulating layer over a photodiode arranged over an OB pixel region include silicon nitride, are formed of the same layer, and are coupled with each other.

11 Claims, 24 Drawing Sheets

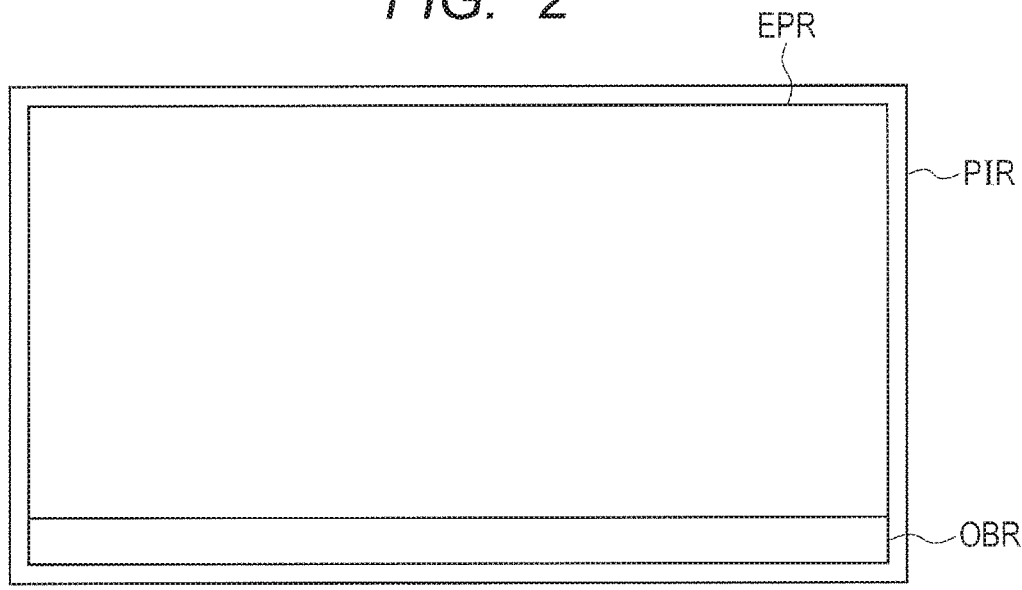
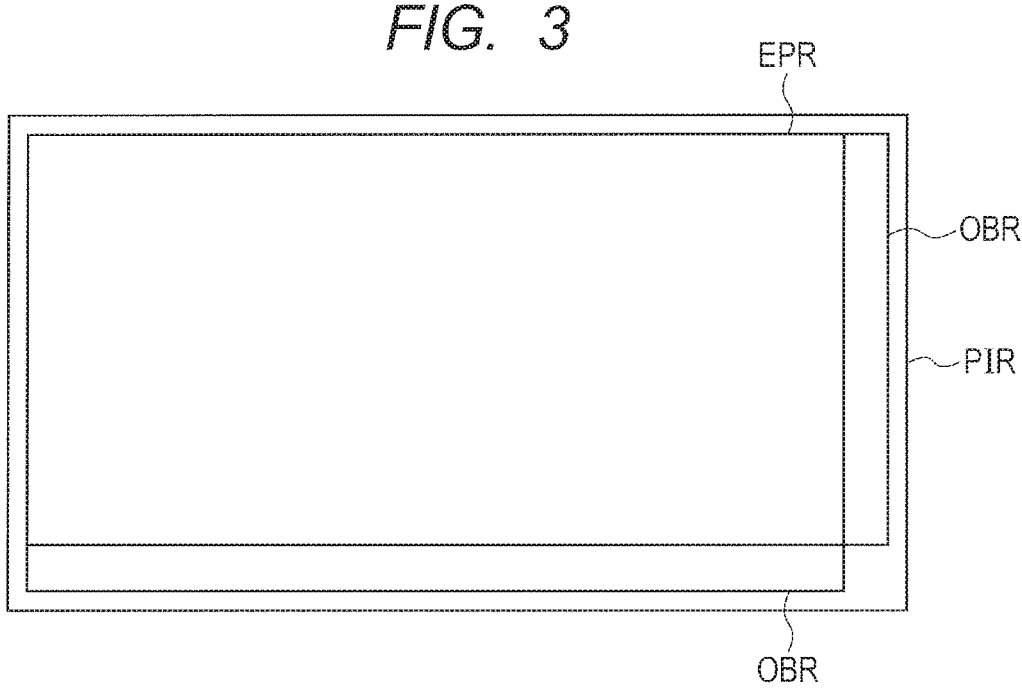

IMAGING DEVICE AND MANUFACTURING METHOD OF THE SAME

CROSS-REFERENCE TO RELATED APPLICATIONS

The disclosure of Japanese Patent Application No. 2015-166804 filed on Aug. 26, 2015 including the specification, drawings and abstract is incorporated herein by reference in its entirety.

BACKGROUND

The present invention relates to an imaging device and a manufacturing method thereof.

An imaging device includes effective pixels and optical black (OB) pixels in a pixel region. The effective pixel is a pixel that receives incident light and obtains an electrical charge by a photoelectric effect. The OB pixel is a light blocking pixel that is light-blocked and thereby outputs a pixel signal independent of incident light.

In an imaging device, an electrical charge occurs even when light does not strike a sensor unit at all due to some residual interface state. A current caused by the electrical charge is called a dark current. It is possible to remove noise caused by the dark current by subtracting information obtained by the OB pixel from information obtained by the effective pixel.

On the other hand, to reduce the dark current described above, hydrogen sintering processing may be performed after an uppermost wiring layer is formed. By this hydrogen sintering processing, a dangling-bond, which is an uncombined hand, generated in a gate insulating layer or the dike is terminated by hydrogen, and the interface state is lowered.

In this case, the OB pixel is covered by a light blocking member which is the uppermost wiring layer. Therefore, the OB pixel may not be able to obtain the same effect of the hydrogen sintering processing as the effective pixel. Therefore, in the OB pixel, the interface state is difficult to be lowered and a level of the dark current tends to be higher than that in the effective pixel.

A technique that suppresses the level of the dark current in the OB pixel is disclosed in, for example, Japanese Unexamined Patent Application Publication No. 2010-16128. In this patent application publication, a hydrogen diffusion preventing film is formed between a hydrogen supply film and a light blocking member in the OB pixel. The hydrogen diffusion preventing film prevents outward diffusion of hydrogen supplied from the hydrogen supply film. Thereby, sufficient hydrogen is supplied to a surface of a photoelectric conversion element of the OB pixel and a gate insulating layer.

SUMMARY

However, the method described in the above patent application publication requires a process to form the hydrogen diffusion preventing film, so that the manufacturing process becomes cumbersome.

Other problems and novel features will become apparent from the description of the present specification and the accompanying drawings.

According to an embodiment, both of a first insulating layer portion over a first light receiving portion arranged in an effective pixel region and a second insulating layer portion over a second light receiving portion arranged in an optical black pixel region include silicon nitride, are formed of the same layer, and are coupled with each other.

According to the embodiment described above, it is possible to lower the level of a dark current in an optical black pixel without forming a new layer such as a hydrogen diffusion preventing film.

BRIEF DESCRIPTION OF THE DRAWINGS

FIG. 2 is a plan view showing an arrangement example of an OB pixel region in a pixel region of the imaging device in FIG. 1.

FIG. 3 is a plan view showing another arrangement example of the GB pixel region in the pixel region of the imaging device in FIG. 1.

DETAILED DESCRIPTION

Hereinafter, embodiments will be described based on the drawings.

First Embodiment

First, each region arranged in a main surface of a semiconductor substrate in an imaging device of the present embodiment will be described with reference to FIGS. 1 to 3.

Figure 1:
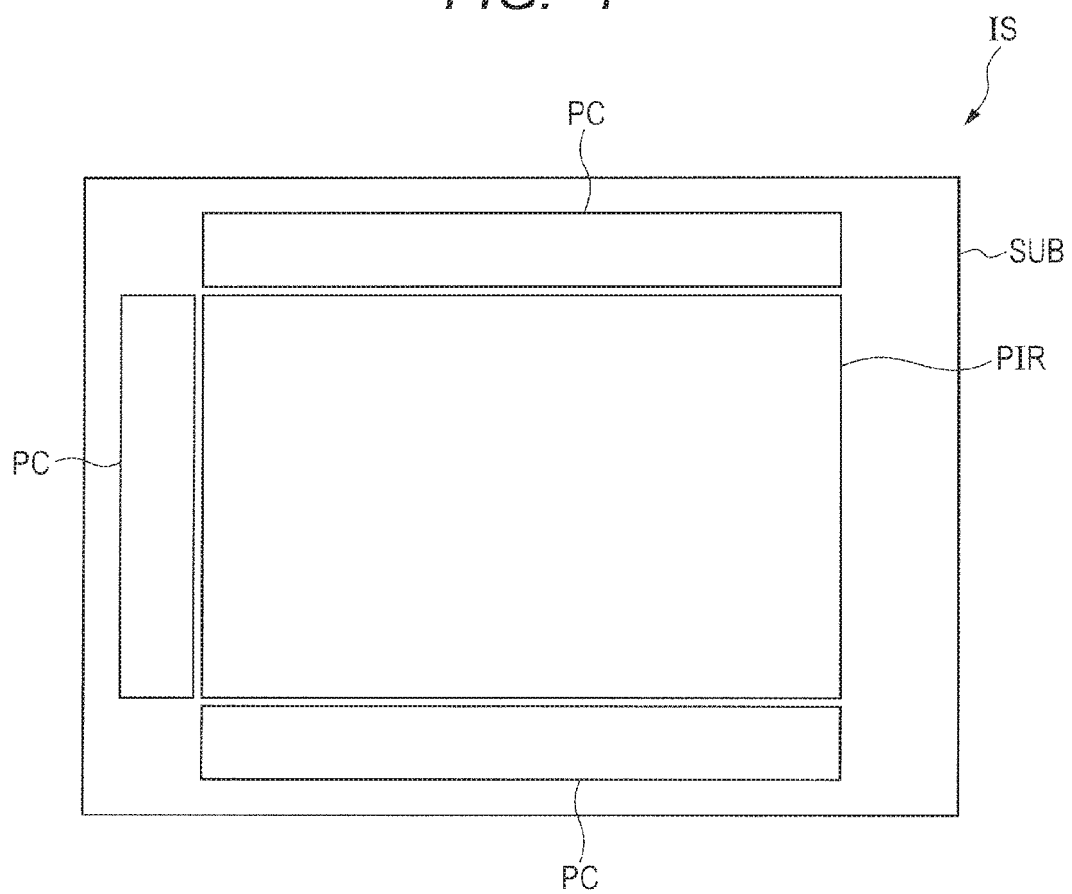
FIG. 1 is a plan view schematically showing a configuration of an imaging device according to a first embodiment.

As shown in FIG. 1, an imaging device IS according to the present embodiment is, for example, in a state of a chip. However, the imaging device IS according to the present embodiment may be in a state of a wafer or in a state of a resin-sealed package. The imaging device IS according to the present embodiment has, for example, mainly a pixel region PIR and peripheral circuit regions PC in a surface of a semiconductor substrate SUB.

The pixel region PIR has a rectangular shape in the main surface of the semiconductor substrate SUB. Here, the rectangular shape in the main surface means to have a rectangular shape in plan view. Further, "in plan view" means to see the main surface of the semiconductor substrate SUB from a viewpoint in a direction perpendicular to the main surface.

The peripheral circuit regions PC are arranged outside of and around the pixel region PIR. The peripheral circuit regions PC are arranged along the external sides of the rectangular pixel region PIR. The peripheral circuit region PC includes, for example, an analog-digital circuit (ADC) or a vertical scanning circuit (VSAN).

In the pixel region PIR, a plurality of pixels (photoelectric conversion elements) are arranged in a matrix form. A signal line (or a control line) is electrically coupled to each of the pixels. A plurality of signal lines include signal lines extending in a row direction and signal lines extending in a column direction. These signal lines linearly extend from inside to outside of the rectangular pixel region PIR and reaches the peripheral circuit regions PC.

As shown in FIG. 2, the pixel region PIR includes an effective pixel region EPR and an OB pixel region OBR. In the effective pixel region EPR, a plurality of effective pixels (photoelectric conversion elements) are arranged in a matrix form. Each of the effective pixels is configured to be able to receive light. The effective pixel is configured to be able to receive, incident light and obtain an electrical charge by a photoelectric effect.

In the OB pixel region OBR, a plurality of OB pixels (photoelectric conversion elements) are arranged in a matrix form. The OB pixels are covered by a light blocking member which is an uppermost wiring layer. The OB pixels have substantially the same configuration as that of the effective pixels except for the above. Each of the OB pixels is configured to be light-blocked by the light blocking member and be able to output a pixel signal independent of incident light.

The effective pixel region EPR has a rectangular shape in the main surface of the semiconductor substrate SUB. The OB pixel region OBR is arranged on the periphery of the effective pixel region EPR. The OB pixel region OBR is arranged along a side (long side) of the outer shape of the rectangular pixel region PIR. However, as shown in FIG. 3, the OB pixel region OBR may be arranged along each of two sides (long side and short side) of the outer shape of the rectangular pixel region PIR. The OB pixel region OBR may be arranged along each of three sides of the outer shape of the rectangular pixel region PIR or may be arranged along each of our sides.

Next, a circuit configuration of each of the pixels (photoelectric conversion elements) arranged in the pixel region PIR will be described with reference to FIG. 4.

Figure 4:
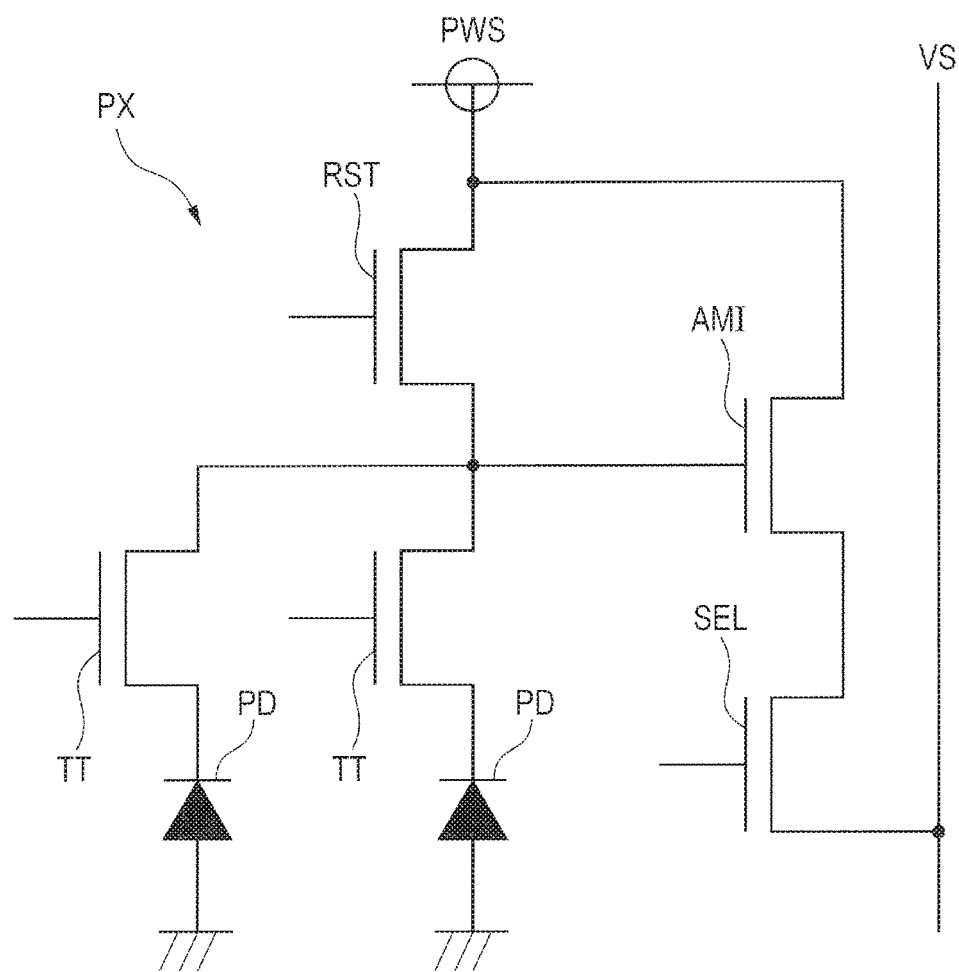
FIG. 4 is a circuit diagram showing a circuit configuration of one pixel in the imaging device shown in FIG. 1.

As shown in FIG. 4, a pixel PX of each of the effective pixel and the OB pixel mainly includes, for example, two photodiodes (photoelectric conversion units) PD, two transfer transistors TT, a reset transistor RST, an amplification transistor AMI, and a selection transistor SEL.

Each of the two photodiodes PD is a photoelectric conversion unit. Each of the two photodiodes PD has a p-type region and an n-type region which form a pn junction. An antireflection film AR (FIGS. 6 and 7) is formed on a light incident side of the photodiode PD. It is preferable that the antireflection film AR has a different structure (film thickness, film quality, and the like) depending on color of light to be imaged.

Each of the two transfer transistors TT, the reset transistor RST, the amplification transistor API, and the selection transistor SEL is an insulated gate field effect transistor. Each of the transistors TT, RST, and AMI is formed of, for example, an n-channel MOS (Metal Oxide Semiconductor) transistor.

Each of the transistors TT, RST, and AMI has a pair of n-type source/drain regions, a gate insulating layer, and a gate electrode layer. The pair of n-type source/drain regions is formed over the surface of the semiconductor substrate SUB. The gate electrode layer is formed over a region of the semiconductor substrate sandwiched by a pair of source/drain regions through the gate insulating layer (for example, a silicon oxide layer).

The p-type region of each of the two photodiodes PD is coupled to, for example, a ground potential. The n-type region of the photodiode PD and the n-type source region of the transfer transistor TT are electrically coupled with each other and are formed of, for example, a common n-type region.

The n-type drain region of each of the two transfer transistors TT is electrically coupled with each other and is formed of, for example, a common n-type region. The n-type drain regions of both of the two transfer transistors TT are electrically coupled with the n-type source region of the reset transistor RST through, for example, a wiring layer.

The n-type drain region of the reset transistor RST and the n-type source region of the amplification transistor AMI are electrically coupled with each other and are formed of, for example, a common n-type region. The n-type drain region of the reset transistor RST and the n-type source region of the amplification transistor AMI are electrically coupled with a power supply line PWS.

The gate electrode layer of the amplification transistor AMI is electrically coupled to the n-type drain regions of both of the two transfer transistors TT and the n-type source region of the reset transistor RST through, for example, a wiring layer.

The n-type drain region of the amplification transistor AMI and the n-type source region of the selection transistor SEL are electrically coupled with each other and are formed of, for example, a common n-type region. The n-type drain region of the selection transistor SEL is electrically coupled to a vertical signal line VS.

Next, a planar configuration of the effective pixel region and the OB pixel region of the imaging device according to the present embodiment will be described with reference to FIG. 5.

Figure 5:
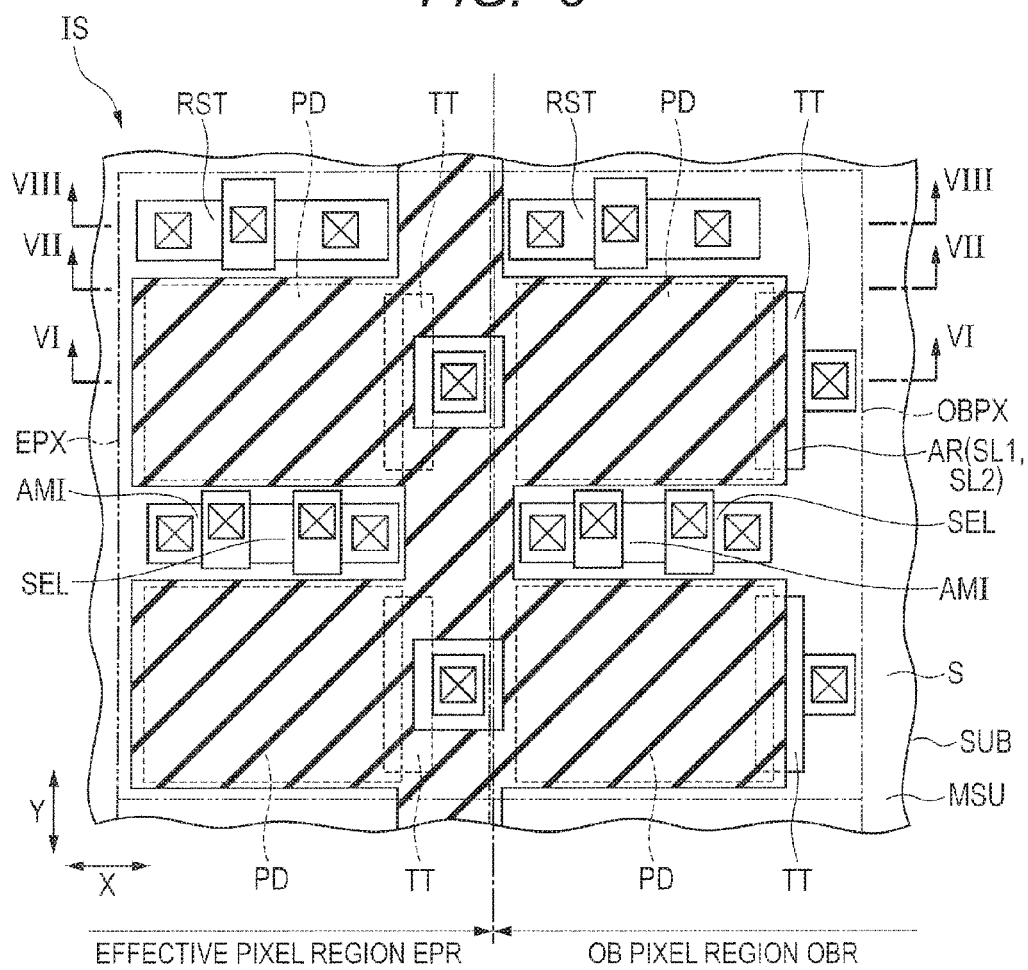
FIG. 5 is an enlarged schematic plan view showing a part of configuration in the pixel region in the imaging device shown in FIG. 1.

As shown in FIG. 5, in the effective pixel region EPR, a plurality of effective pixels EPX are arranged in a matrix form. In the OB pixel region OBR, a plurality of OB pixels OBPX are arranged in a matrix form. The OB pixel OBPX has the same configuration as that of the effective pixel EPX except that an uppermost wiring layer is formed as a light blocking member in the OB pixel OBPX.

Each of the effective pixel EPX and the OB pixel OBPX has two photodiodes PD as described above. Each of the two photodiodes PD has a rectangular shape in the main surface of the semiconductor substrate SUB.

In each of the effective pixel EPX and the OB pixel OBPX, the reset transistor RST is arranged on one side of opposite sides of one photodiode PD. Further, the amplification transistor AMI and the selection transistor SEL are arranged on the other side of the opposite sides of the photodiode PD. The amplification transistor AMI and the selection transistor SEL are arranged between the two photodiodes PD that form one pixel. The transfer transistor TT is arranged on a side where the transistor RST, AMI, or SEL is not arranged among the sides of the rectangular photodiode PD.

The antireflection film AR is formed over the main surface of the semiconductor substrate SUB. The antireflection film AR has, for example, a laminated structure of an insulating layer SL1 and an insulating layer SL2. The insulating layer SL1 is formed of a material including silicon oxide. The insulating layer SL2 is formed of a material including silicon nitride.

The insulating layer SL1 is in contact with the main surface of the semiconductor substrate SUB over the photodiode PD of each of the effective pixel EPX and the OB pixel OBPX. A portion (first insulating layer) of the insulating layer SL1 located immediately above a photodiode PD (first light receiving portion) in the OB pixel OBPX and a portion (second insulating layer) of the insulating layer SL1 located immediately above a photodiode PD (second light receiving portion) in the effective pixel EPX are integrally formed from, for example, the same insulating layer SL1.

A portion (first insulating layer portion) of the insulating layer SL2 located immediately above the photodiode PD (the first light receiving portion) in the OS pixel OBPX is in contact with the portion (the first insulating layer) of the insulating layer SL1 over the photodiode PD (the first light receiving portion).

A portion (second insulating layer portion) of the insulating layer SL2 located immediately above the photodiode PD (the second light receiving portion) in the effective pixel EPX is in contact with the portion (the second insulating layer) of the insulating layer SL1 over the photodiode PD (the second light receiving portion).

The portion (the first insulating layer portion) of the insulating layer SL2 in the OB pixel OBPX and the portion (the second insulating layer portion) of the insulating layer SL2 in the effective pixel EPX are coupled to each other and are integrally formed from the same insulating layer SL2. The insulating layer SL2 is, for example, a single layer of a silicon nitride layer.

Further, the portion (the first insulating layer) of the insulating layer SL1 in the OB pixel OBPX and the portion (the second insulating layer) of the insulating layer SL1 in the effective pixel EPX are coupled to each other and are integrally formed from the same insulating layer SL1. The insulating layer SL1 is, for example, a single layer of a silicon oxide layer.

The antireflection film AR (the insulating layers SL1 and SL2) is located in a region immediately above the photodiode PD of each pixel and a portion located immediately above each pixel is coupled with each other. The antireflection film AR (the insulating layers SL1 and SL2) is not formed over the reset transistor RST, the amplification transistor AMI, and the selection transistor SEL, and regions where the antireflection film AR is not formed are opened.

Next, a cross-sectional configuration of the effective pixel region and the OB pixel region of the imaging device according to the present embodiment will be described with reference to FIGS. 6 to 8.

Figure 6:
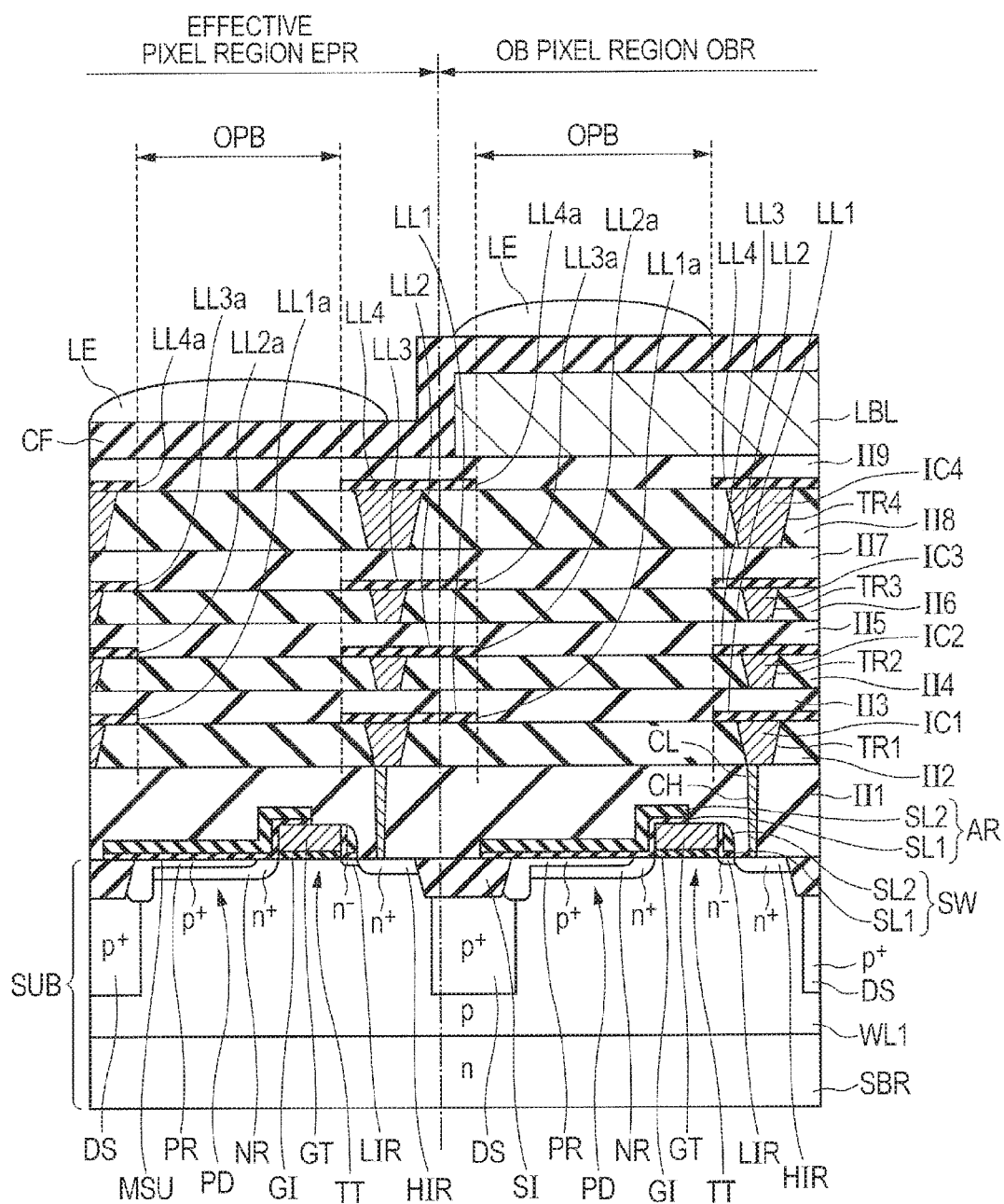
FIG. 6 is a schematic cross-sectional view taken along line VI-VI in FIG. 5.
Figure 7:
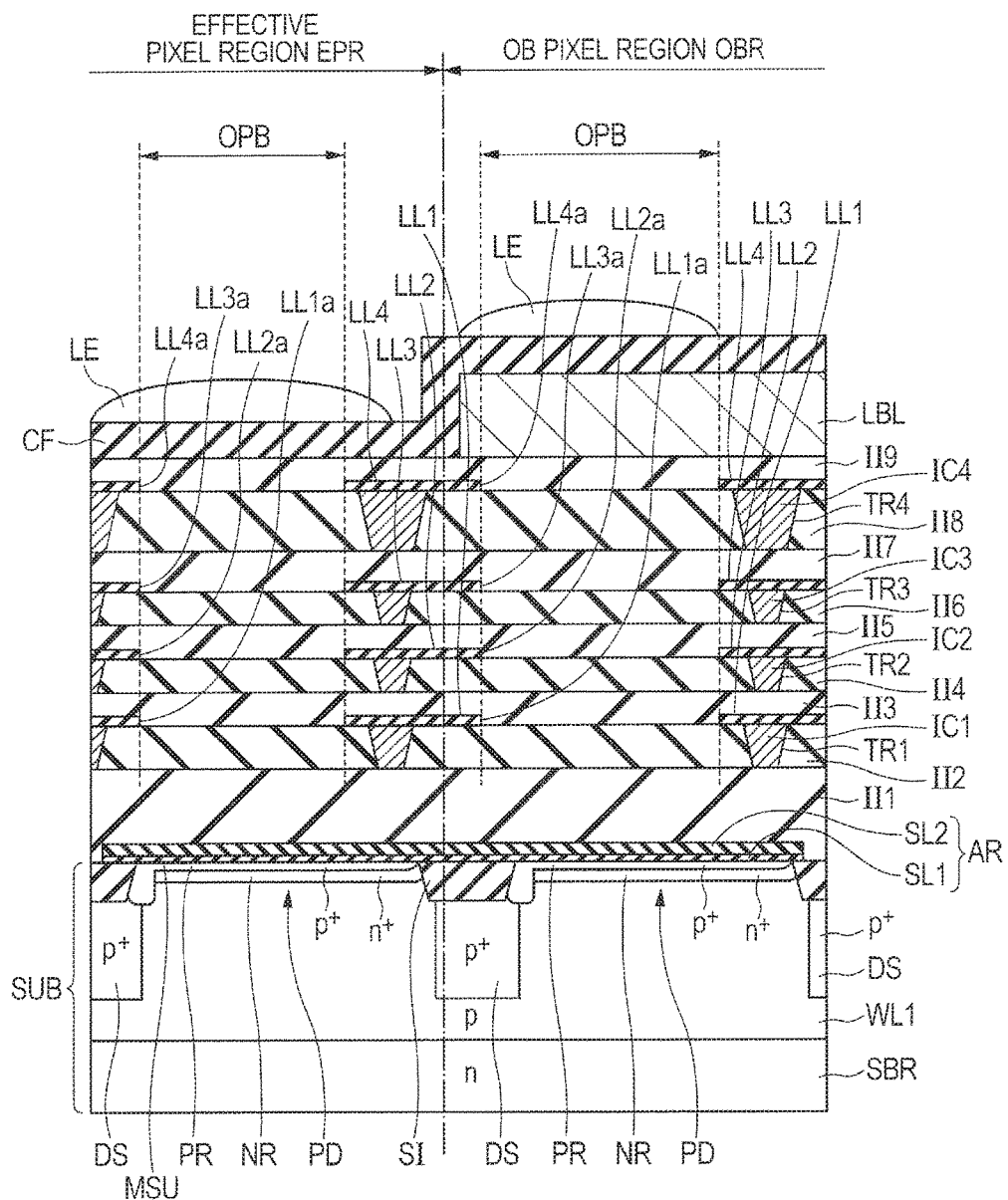
FIG. 7 is a schematic cross-sectional view taken along line VII-VII in FIG. 5.

As shown in FIGS. 6 and 7, an n-type region SBR is formed in the semiconductor substrate SUB in each of the effective pixel region EPR and the OB pixel region OBR. A p-type well region WL1 is formed over the n-type region SBR in the semiconductor substrate SUB. The semiconductor substrate SUB is formed of, for example, a single crystal silicon.

An element isolation insulating layer SI is formed over the main surface of the semiconductor substrate SUB. The element isolation insulating layer SI is, for example, STI (Shallow Trench isolation). The element isolation insulating layer SI includes a trench formed in a main surface MSU of the semiconductor substrate SUB and an insulating layer embedded in the trench. A $p^+$ region DS is formed below the element isolation insulating layer SI as an element isolation region.

The photodiode PD and the transfer transistor TT are formed over a surface of the p-type well region WL1 (the main surface of the semiconductor substrate SUB).

In FIGS. 6 and 7, for convenience of description, elements such as transistors other than the photodiode PD and the transfer transistor TT are omitted. The photodiode PD in FIGS. 6 and 7 corresponds to the photodiode PD shown in FIGS. 4 and 5. The transfer transistor TT in FIG. 6 corresponds to the transfer transistor TT shown in FIGS. 4 and 5.

As shown in FIGS. 6 and 7, the photodiode PD includes a $p^+$ region PR and an $n^+$ region NR. The $p^+$ region PR is formed in the main surface of the semiconductor substrate SUB in each of the effective pixel region EPR and the OB pixel region OBR. The $n^+$ region NR covers a lower side of the $p^+$ region PR and forms a pn junction with the $p^+$ region PR.

The antireflection film AR is formed over the main surface of the semiconductor substrate SUB so as to cover the photodiode PD. The antireflection film AR has a laminated structure of the insulating layer SL1 and the insulating layer SL2. The insulating layer SL1 is, for example, a silicon oxide layer. The insulating layer SL2 is, for example, a silicon nitride layer.

The insulating layer SL1 is formed so as to be in contact with the main surface of the semiconductor substrate SUB over the photodiode PD. The insulating layer SL2 is formed over the insulating layer SL1 immediately above the photodiode PD. The insulating layer SL2 is formed over the silicon oxide layer SL1 so as to be in contact with the insulating layer SL1.

The transfer transistor TT includes an n-type source region NR, n-type drain regions LIR and HIR, a gate insulating layer GI, and a gate electrode layer GT. The n-type source region NR is formed over the main surface of the semiconductor substrate SUB. The n-type source region NR is formed from an n-type region in common with an n-type region NR of the photodiode PD.

The n-type drain regions LIR and HIR are formed over the main surface of the semiconductor substrate SUB with a distance away from the n-type source region NR. The n-type drain regions LIP, and HIR have an LDD (Lightly Doped Drain) structure and have an $n^-$ region LIR and an $n^+$ region HIR. Both of the $n^-$ region. LIR and the $n^+$ region HIR are formed over the main surface of the semiconductor substrate SUB. The $n^-$ region LIR is in contact with a side of the $n^+$ region HIR facing the n-type region NR.

The gate electrode layer GT is formed over the main surface of the semiconductor substrate SUB sandwiched by the n-type source region NR and the n-type drain regions LIR and HIR with the gate insulating layer GI in between. One end of the antireflection film AR runs on the gate electrode layer GT. Thereby, the antireflection film AR may double as a side wall insulating layer of the gate electrode layer GT.

A side wall insulating layer SW is formed over a side wall of the gate electrode layer GT opposite to the antireflection film AR. The side wall insulating layer SW has, for example, a laminated structure of the insulating layer SL1 and the insulating layer SL2 in the same manner as the antireflection film AR.

Figure 8:
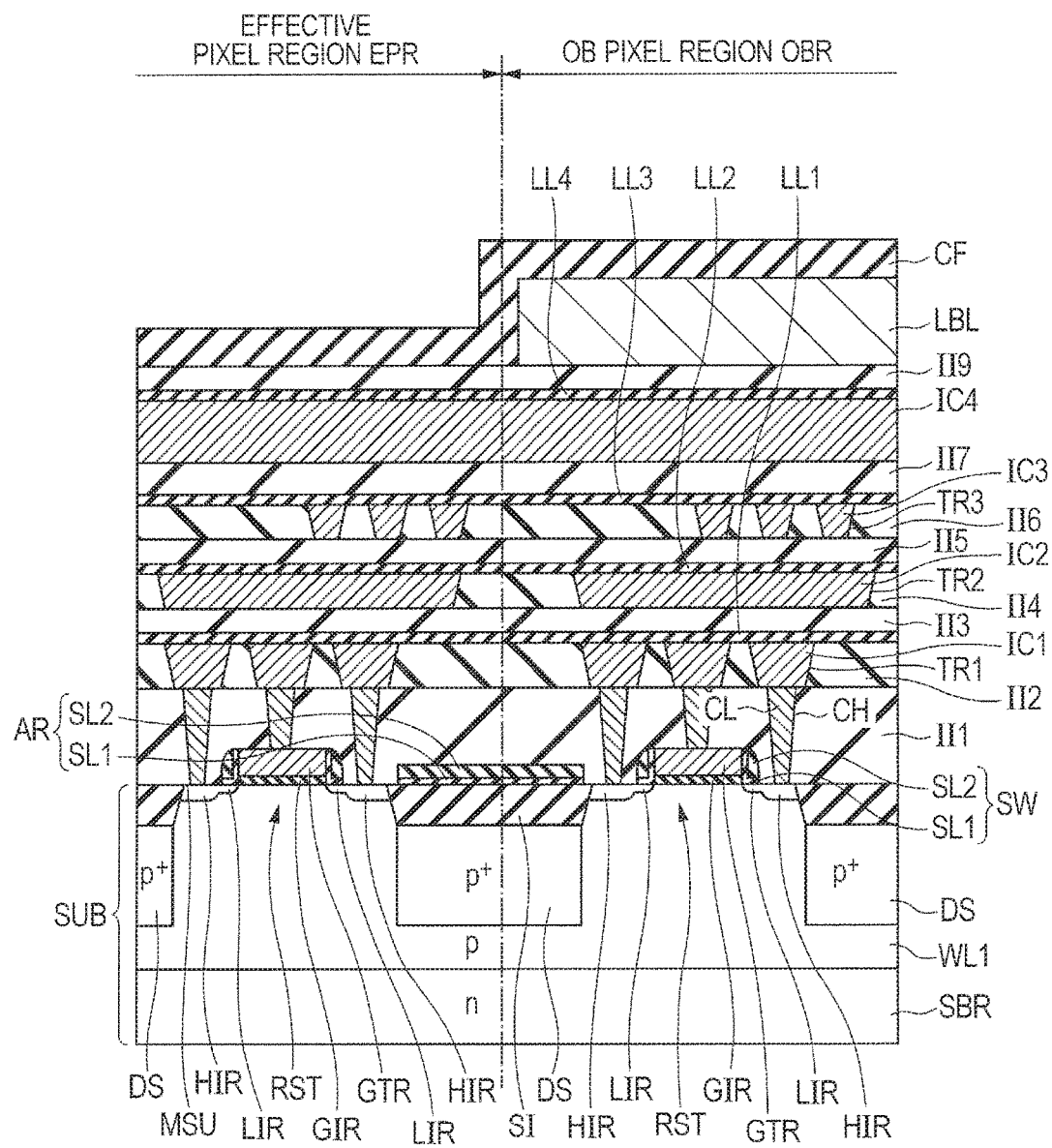
FIG. 8 is a schematic cross-sectional view taken along line VIII-VIII in FIG. 5.

As shown in FIG. 8, in each of the effective pixel region EPR and the OB pixel region OBR, the reset transistor RST includes a pair of n-type source/drain regions LIR and HIR, a gate insulating layer GIR, and a gate electrode layer GTR. A pair of n-type source regions LIR and HIR are formed over the main surface of the semiconductor substrate SUB with a distance away from each other.

Each of the pair of n-type source regions LIR and HIR has an LDD structure and has an $n^-$ region LIR and an $n^+$ region HIR. Both of the $n^-$ region LIR and the $n^+$ region HIR are formed over the main surface of the semiconductor substrate SUB. The $n^-$ region LIR, and the $n^+$ region HIR are in contact with each other. The gate electrode layer GTR is formed over the main surface of the semiconductor substrate SUB sandwiched by the pair of n-type source regions LIR and HIR with the gate insulating layer GIR in between.

A side wall insulating layer SW is formed over a side wall of the gate electrode layer GTR. The side wall insulating layer SW has, for example, a laminated structure of the insulating layer SL1 and the insulating layer SL2 in the same manner as the antireflection film AR described above.

The antireflection film AR is formed over the element isolation insulating layer SI located between two reset transistors RST and does not cover the two reset transistors RST.

As shown in FIGS. 6 to 8, an interlayer insulating layer II1 is formed so as to cover the main surface of the semiconductor substrate SUB in each of the effective pixel region EPR and the OB pixel region OBR. The interlayer insulating layer II1 is formed of, for example, a silicon oxide layer. In the interlayer insulating layer II1, a plurality of contact holes CH that reach the source/drain regions and the gate electrode layer of each transistor are formed. An embedded conductive layer CL is formed so as to fill inside of each contact hole CH.

An interlayer insulating layer II2 is formed over a surface of the interlayer insulating layer II1. The interlayer insulating layer II2 is formed of, for example, a silicon con oxide layer. A wiring trench TR1 is formed in the interlayer insulating layer II2. A wiring layer IC1 is formed in the wiring trench TR1. The wiring layer IC1 is formed of a material including copper, for example, formed of a material such as copper (Cu) and copper-aluminum (CuAl).

A liner insulating layer LL1 is formed over the interlayer insulating layer II2 so as to cover the wiring layer IC1. The liner insulating layer LL1 is for preventing copper included in the wiring layer IC1 from diffusing. The liner insulating layer LL1 is formed of a material including nitrogen, for example, formed of a material such as silicon nitride (SiN) and silicon carbonitride (SiCN).

An opening LL1$a$ is formed in the liner insulating layer LL1. The opening LL1$a$ is a portion where the liner insulating layer LL1 is removed from a region immediately above the photodiode PD. In other words, the opening LL1$a$ is a portion where the liner insulating layer LL1 is removed from a region immediately above the photoelectric conversion unit of the photoelectric conversion element in the pixel regions EPR and OBR. The opening LL1$a$ may be opened not only in a region immediately above the photodiode PD, but also in a region immediately above another region (for example, a formation region of the transfer transistor TT).

An interlayer insulating layer II3 is formed so as to cover the liner insulating layer LL1. The interlayer insulating layer II3 is formed of, for example, a silicon oxide layer. The interlayer insulating layer II3 is embedded in the opening LL1$a$ of the liner insulating layer LL1. A plurality of through-holes (not shown in the drawings) that reach each wiring layer IC1 or the like are formed in the interlayer insulating layer II3. An embedded conductive layer (not shown in the drawings) is formed so as to fill inside of each through-hole.

An interlayer insulating layer II4 is formed over a surface of the interlayer insulating layer II3. The interlayer insulating layer II4 is formed of, for example, a silicon oxide layer. A wiring trench TR2 is formed in the interlayer insulating layer II4. A wiring layer IC2 is formed in the wiring trench TR2. The wiring layer IC2 is formed of a material including copper, for example, formed of a material such as copper and copper-aluminum.

A liner insulating layer LL2 is formed over the interlayer insulating layer II4 so as to cover the wiring layer IC2. The liner insulating layer LL2 is for preventing copper included in the wiring layer IC2 from diffusing. The liner insulating layer LL2 is formed of a material including nitrogen, for example, formed of a material such as silicon nitride and silicon carbonitride.

An opening LL2$a$ is formed in the liner insulating layer LL2. The opening LL2$a$ is a portion where the liner insulating layer LL2 is removed from a region immediately above the photodiode PD in a pixel region GAR. In other words, the opening LL2$a$ is a portion where the liner insulating layer LL2 is removed from a region immediately above the photoelectric conversion unit of the photoelectric conversion element in the pixel regions EPR and OBR. The opening LL2$a$ may be opened not only in a region immediately above the photodiode PD, but also in a region immediately above another region (for example, a formation region of the transfer transistor TT).

Interlayer insulating layers II5 and II6, a wiring trench TR3, a wiring layer IC3, a liner insulating layer LL3, and the like are formed over the liner insulating layer LL2. The interlayer insulating layer II5 is about the same as the interlayer insulating layer II3, and the interlayer insulating layer II6 is about the same as the interlayer insulating layer II4. The wiring trench TR3 is about the same as the wiring trench TR2, the wiring layer IC3 is about the same as the wiring or IC2, and the liner insulating layer LL3 is about the same as the liner insulating layer LL2. Therefore, the interlayer insulating layers II5 and II6, the wiring trench TR3, the wiring layer IC3, and the liner insulating layer LL3 will not be redundantly described.

Interlayer insulating layers II7 and II8, a wiring trench TR4, a wiring layer IC4, a liner insulating layer LL4, and the like are formed over the liner insulating layer LL3. The interlayer insulating layer II7 is about the same as the interlayer insulating layer II3, and the interlayer insulating layer II8 is about the same as the interlayer insulating layer II4. The wiring trench TR4 is about the same as the wiring trench TR2, the wiring layer IC4 is about the same as the wiring layer IC2, and the liner insulating layer LL4 is about the same as the liner insulating layer LL2. Therefore, insulating layers II7 and II8, the wiring trench TR4, the wiring layer IC4, and the liner insulating layer LL4 will not be redundantly described.

An interlayer insulating layer II9 is formed so as to cover the liner insulating layer LL4. The interlayer insulating layer II9 is formed of, for example, a silicon oxide layer. In the OB pixel region OBR, a light blocking layer LBL is formed over the interlayer insulating layer II9. The light blocking layer LBL is formed of, for example, a material such as copper and aluminum.

In the effective pixel region EPR and the OB pixel region OBR, a microlens LE is formed over the interlayer insulating layer II9 and the light blocking layer LBL through a color filter CF.

In the effective pixel region EPR and the OB pixel region OBR, the openings LL1a to LL4a formed respectively in a plurality of liner insulating layers LL1 to LL4 are located in a region immediately above the photodiode PD and are mutually superimposed in plan view. An intra-pixel through portion OPB is formed by the openings LL1a to LL4a. In other words, a region where the openings LL1a to LL4a are mutually superimposed in plan view forms the intra-pixel through portion OPB.

In the effective pixel region EPR and the OB pixel region OBR, each of the liner insulating layers LL1 to LL4 is not removed except for regions of formation regions of the openings LL1a to LL4a and formation regions of via holes. In other words, a region in the pixel region GAR except for the formation regions of the openings LL1a to LL4a and the formation regions of via holes is covered by each of the liner insulating layers LL1 to LL4.

Next, a manufacturing method of the imaging device of the present embodiment will be described with reference to FIGS. 9 to 14.

Figure 9:
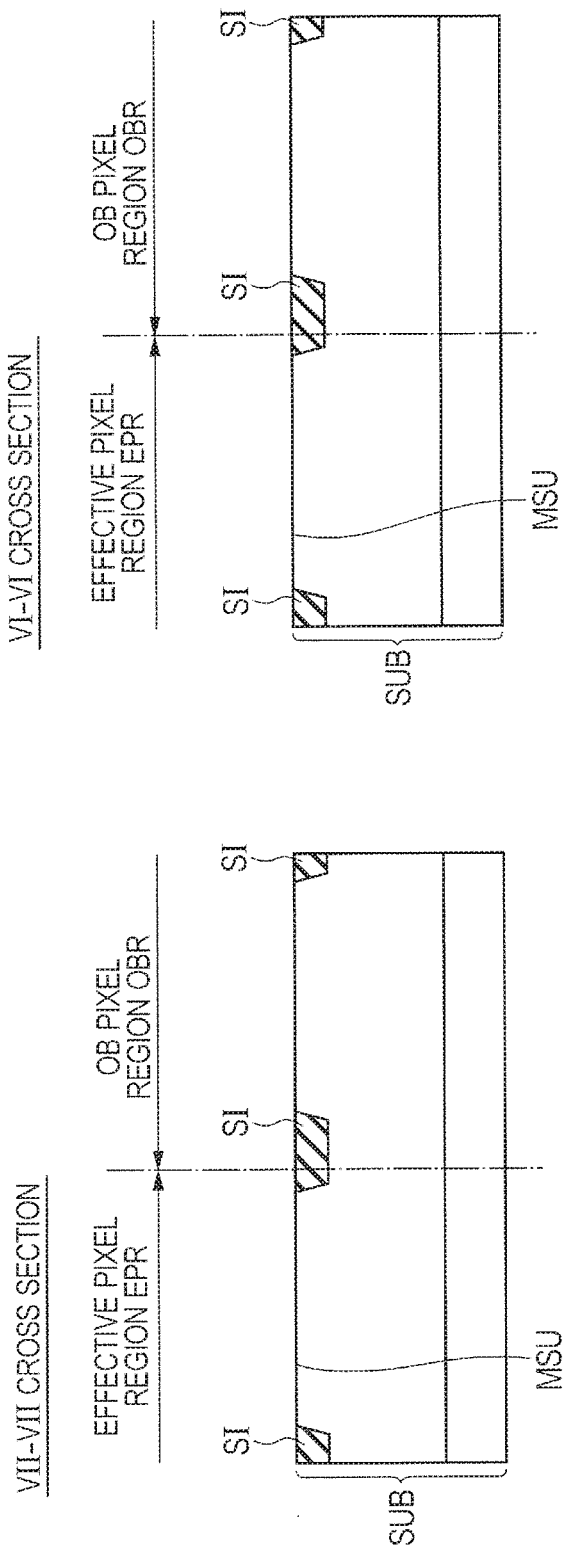
FIG. 9 is a cross-sectional view schematically showing a first process of a manufacturing method of the imaging device according to the first embodiment.

As shown in FIG. 9, the semiconductor substrate SUB including the main surface MSU is prepared. The semiconductor substrate SUB is formed of, for example, a single crystal silicon. For example, the element isolation insulating layer SI formed of, for example, STI is formed over the main surface MSU of the semiconductor substrate SUB.

Figure 10:
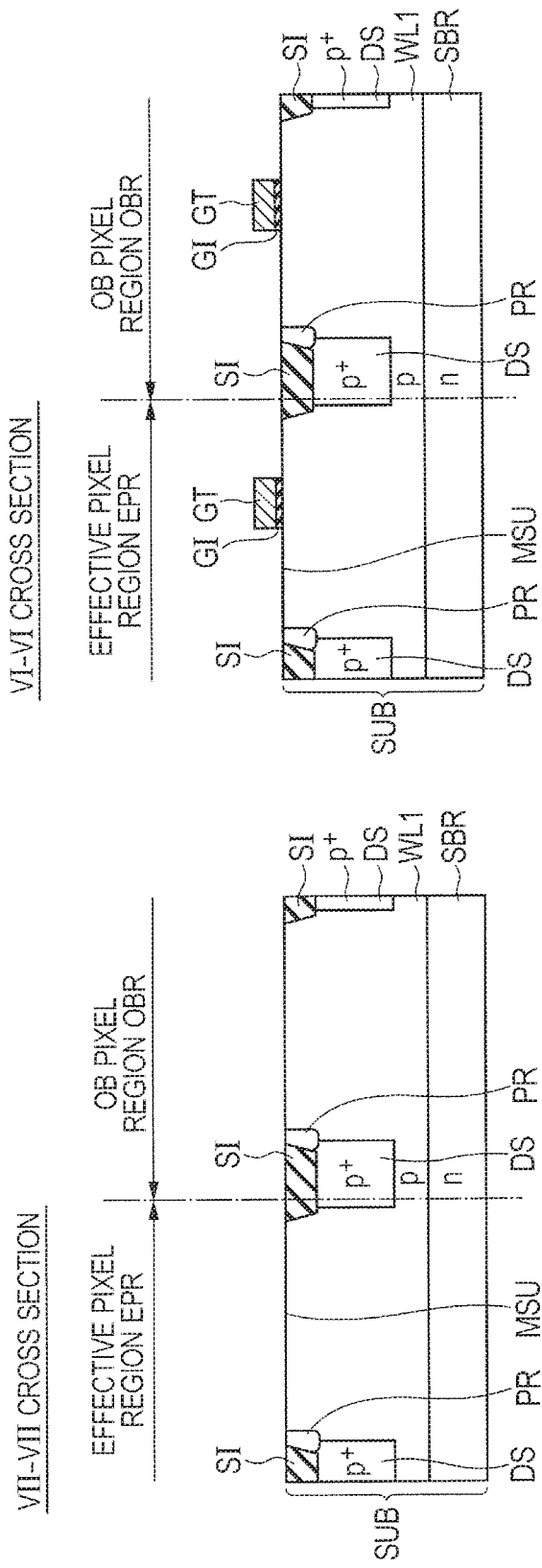
FIG. 10 is a cross-sectional view schematically showing a second process of the manufacturing method of the imaging device according to the first embodiment.

As shown in FIG. 10, the n-type region SBR, the n-type region SBR, the p-type well region WL1, the p$^+$ region DS and the p$^+$ region PR are formed in the semiconductor substrate SUB. The p-type well region WL1 is formed over the n-type region SBR. The p$^+$ region DS is formed below the element isolation insulating layer SI in the p-type well region WL1. The p$^+$ region PR is formed in the main surface MSU of the semiconductor substrate SUB and beside the element isolation insulating layer SI.

Figure 11:
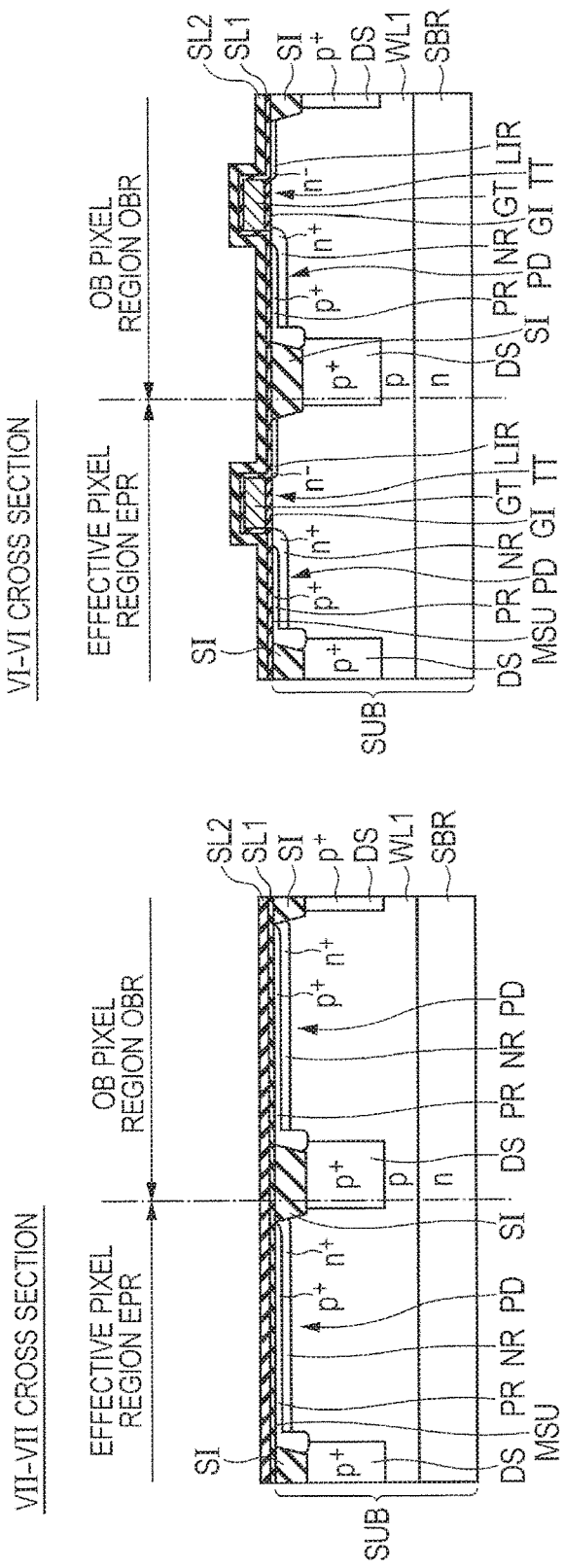
FIG. 11 is a cross-sectional view schematically showing a third process of the manufacturing method of the imaging device according to the first embodiment.

As shown in FIG. 11, the gate electrode layer GT is formed over the main surface MSU of the semiconductor substrate SUB through the gate insulating layer GI. The n$^+$ region NR used as the drain of the transfer transistor TT and the n-type region of the photodiode PD is formed in the semiconductor substrate SUB by ion implantation or the like. Thereafter, a p$^+$ region PR is formed in the main surface MSU of the semiconductor substrate SUB and the p$^+$ PR is integrated with the previously formed p$^+$ region PR beside the element isolation insulating layer SI. Thereby, a p-type region PR of the photodiode PD is formed.

Thereafter, the n$^-$ region LIR is formed in the main surface MSU of the semiconductor substrate SUB by ion implantation or the like.

Thereafter, the insulating layer SL1 is formed so as to cover the gate electrode layer GT and be in contact with the main surface MSU of the semiconductor substrate SUB. The insulating layer SL1 is formed of, for example, a silicon oxide layer. Thereafter, the insulating layer SL2 is formed over the insulating layer SL1 so as to in contact with the insulating layer SL1. The insulating layer SL2 is formed of, for example, a silicon nitride layer.

Figure 12:
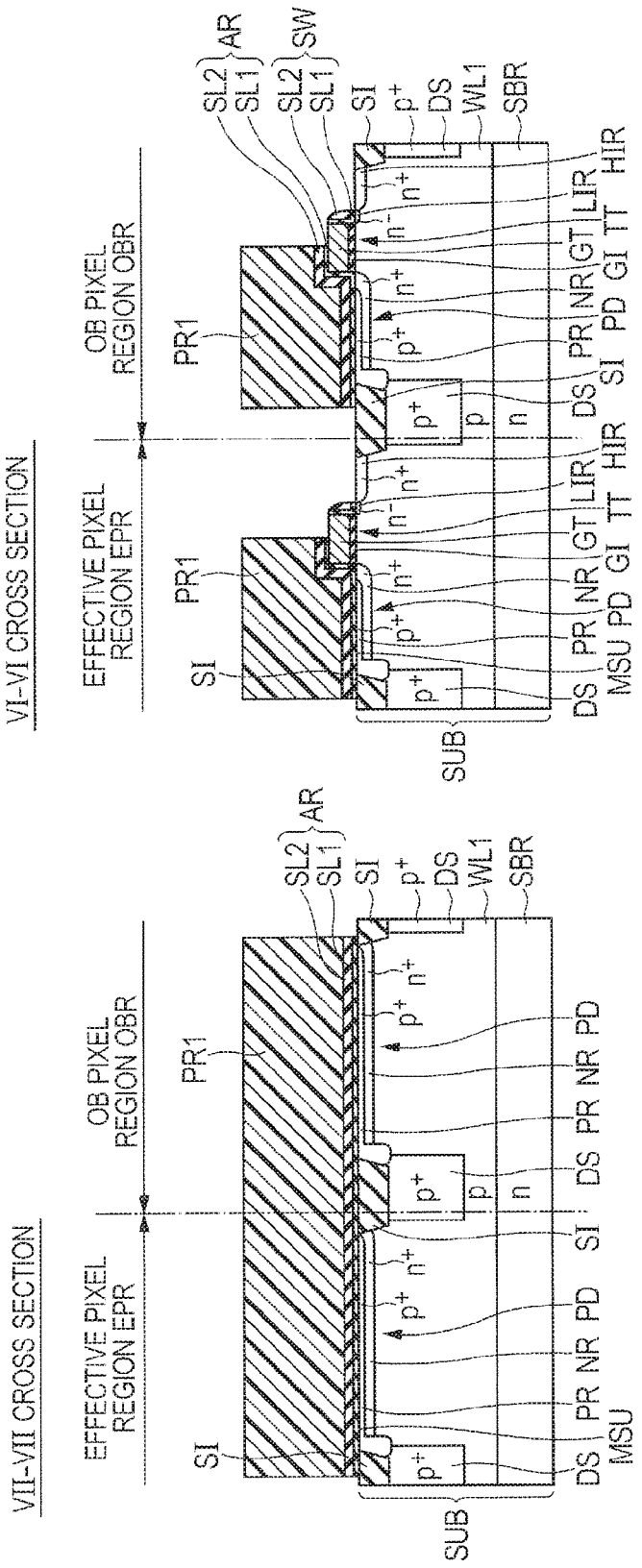
FIG. 12 is a cross-sectional view schematically showing a fourth process of the manufacturing method of the imaging device according to the first embodiment.

As shown in FIG. 12, a photoresist PR1 is coated over the insulating layer SL2. The photoresist PR1 is patterned by a normal photoengraving technique. Anisotropic etching is performed on the insulating layers SL1 and SL2 by using a pattern of the photoresist PR1 as a mask.

The insulating layers SL1 and SL2 are patterned by the etching. Thereby, the antireflection film AR formed from the insulating layers SL1 and SL2, and the side wall insulating layer SW are formed. As shown in FIG. 5, the antireflection film AR is formed so that the antireflection film AR covers at least the photodiode PD and a portion over the photodiode PD of each pixel is coupled to each other. The insulating layers SL1 and SL2 remain so as to cover a side wall of the gate electrode layer GT and the like, so that the side wall insulating layer SW is formed.

Thereafter, the pattern of the photoresist PR1 is removed by, for example, ashing.

Figure 13:
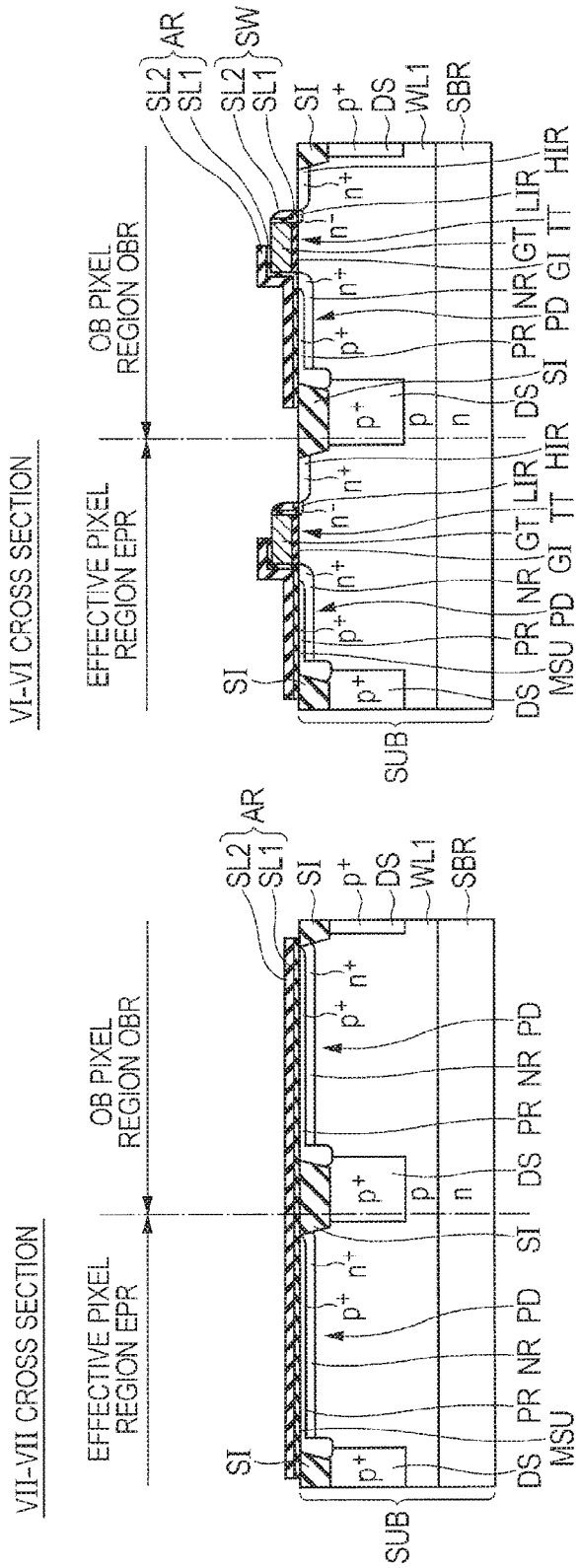
FIG. 13 is a cross-sectional view schematically showing a fifth process of the manufacturing method of the imaging device according to the first embodiment.

As shown in FIG. 13, an upper surface of the antireflection film AR is exposed by removing the photoresist PR1.

Figure 14:
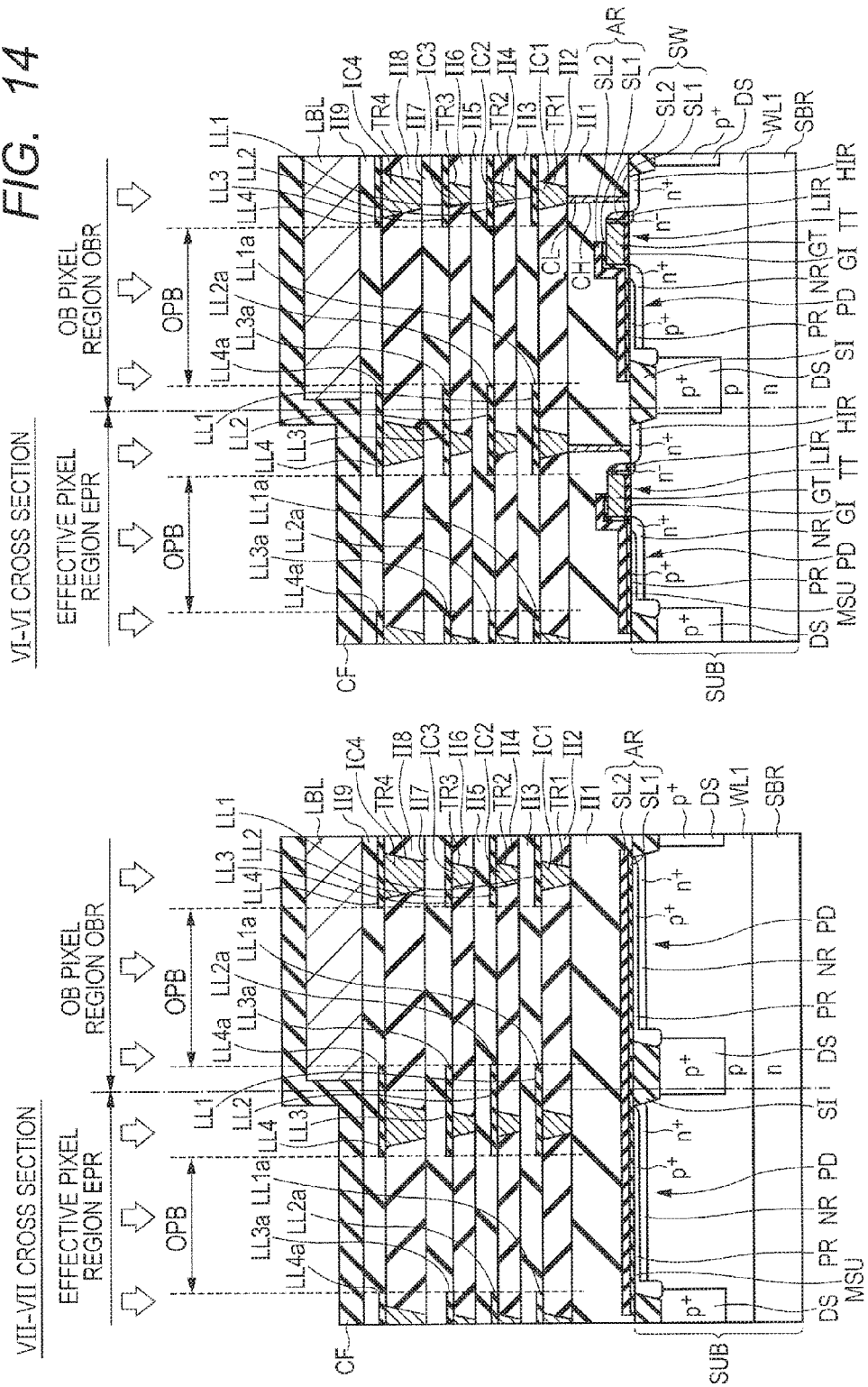
FIG. 14 is a cross-sectional view schematically showing a sixth process of the manufacturing method of the imaging device according to the first embodiment.

Thereafter, as shown in FIG. 14, the interlayer insulating layers II1 to II9, the liner insulating layers LL1 to LL4, the wiring layers IC1 to IC4, and the like are appropriately formed over the main surface MSU of the semiconductor substrate SUB.

The light blocking layer LBL is formed over the interlayer insulating layer II9. The light blocking layer LBL is patterned by a normal photoengraving technique and an etching technique. Thereby, the light blocking layer LBL is remained only over the OB pixel region OBR. The color filter CF is formed so as to cover the light blocking layer LBL and the interlayer insulating layer II9.

In this state, UV cure is performed to suppress generation of dark current. The UV cure is performed by irradiating the imaging device with UV light and then performing heat treatment in a condition of low pressure and high temperature. The heat treatment is performed by, for example, maintaining a temperature of 400° C. for ten minutes. The principle where the generation of dark current is suppressed by the UV cure is considered as described below.

Electrons close to the main surface MSU of the semiconductor substrate SUB are excited by the irradiation of UV light. The excited electrons jump over the insulating layer SL1 formed of, for example, silicon oxide. The electrons that jump over the insulating layer SL1 are captured in an interface between the insulating layer SL1 and the insulating layer SL2 or in a film of the insulating layer SL2 formed of, for example, silicon nitride.

As a result that the electrons are captured and accumulated in the interface between the insulating layer SL1 and the insulating layer SL2 or in the film of the insulating layer SL2, a hole accumulation layer is induced in the main surface MSU of the semiconductor substrate SUB. As a result, the potential in the main surface MSU of the semiconductor substrate SUB shifts to a lower value, so that no potential well is formed around the main surface MSU.

As described above, the potential well (portion where potential is high) is not formed in the main surface MSU of the semiconductor substrate SUB, so that electrons generated by the photoelectric conversion are effectively accumulated in the $n^+$ region NR having the highest potential. The electrons accumulated in the $n^+$ region NR can be completely read or discharged. Therefore, it is possible to suppress generation of dark current and improve quantum efficiency.

After the UV cure, the microlens LE is formed, so that the imaging device of the present embodiment shown in FIGS. 5 to 8 is manufactured.

Next, a result of study of a relationship between the configuration of the antireflection film AR and the dark characteristics, which had been performed by the inventors, will be described with reference to FIGS. 15 to 18.

Figure 15:
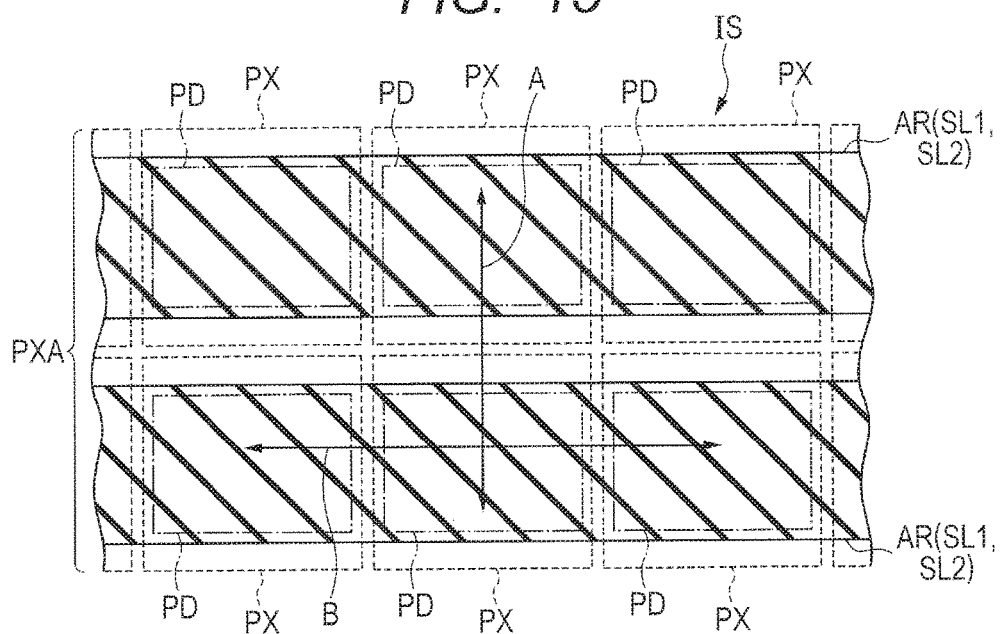
FIG. 15 is a plan view schematically showing a configuration of an imaging device used for verification of change in dark characteristics by UV (Ultra Violet) cure.

First, to study the dark characteristics, the imaging device IS having a configuration as shown in FIG. 15 is used. The imaging device IS has a pixel array PXA including a plurality of pixels PX arranged in a matrix form along both of a direction A and a direction B in FIG. 15. In the imaging device IS, the antireflection films AR (insulating layers SL1 and SL2) of the pixels PX arranged in the direction A in FIG. 15 are separated from each other as shown in FIG. 15. On the other hand, the antireflection films AR (insulating layers SL1 and SL2) of the pixels PX arranged in the direction B in FIG. 15 are coupled with each other.

In the imaging device IS, for ease of description, only one photodiode PD included in the pixel PX is shown by a dashed-dotted line and the other photodiodes and transistors are omitted.

Figure 16:
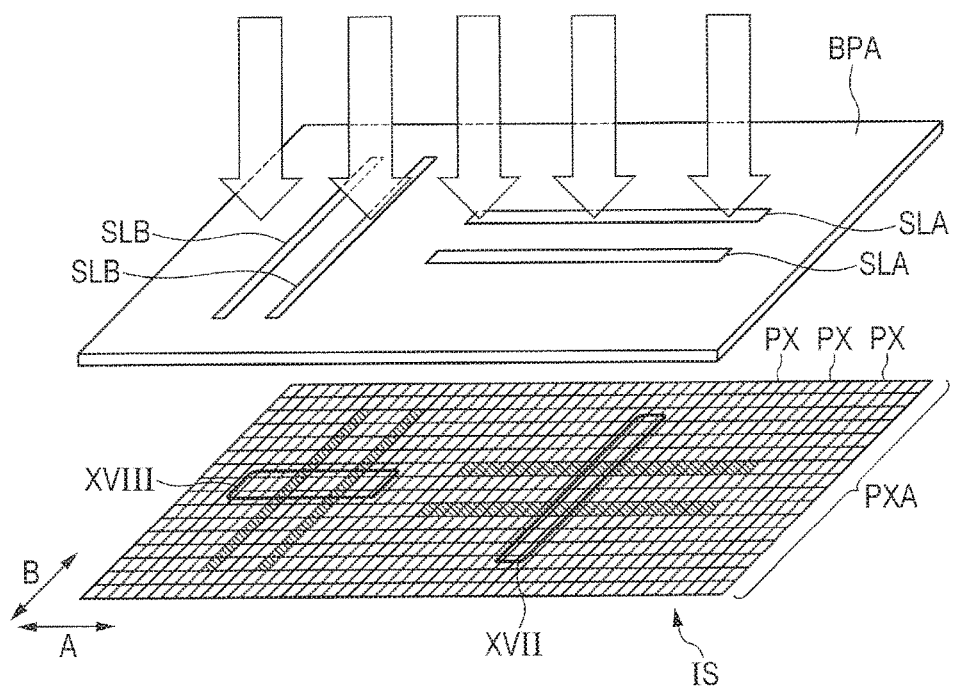
FIG. 16 is a perspective view for explaining a verification method of the change in dark characteristics by UV cure.

As shown in FIG. 16, the UV light is selectively irradiated to a part of pixels PX of the imaging device IS shown in FIG. 15 by using a light blocking pattern BPA. The light blocking pattern BPA has slits SLA extending long in the direction A and slits SLB extending long in the direction B.

The UV light is irradiated to the imaging device IS through the light blocking pattern BPA, so that the UV light is irradiated to a plurality of pixels PX arranged in the direction A and a plurality of pixels PX arranged in the direction B. In FIG. 16, the pixels PX with hatching represent pixels irradiated with the UV light.

The inventors have examined dark characteristics in a region XVII and a region XVIII in FIG. 16 to examine changes of the dark characteristics around the pixel PX irradiated with the UV light. The results of the above are shown in FIGS. 17 and 18.

The region XVII includes a plurality of pixels arranged in a direction (the direction A) in which the antireflection films AR are separated from each other. The region XVIII includes a plurality of pixels arranged in a direction (the direction B) in which the antireflection films AR are coupled with each other.

Figure 17:
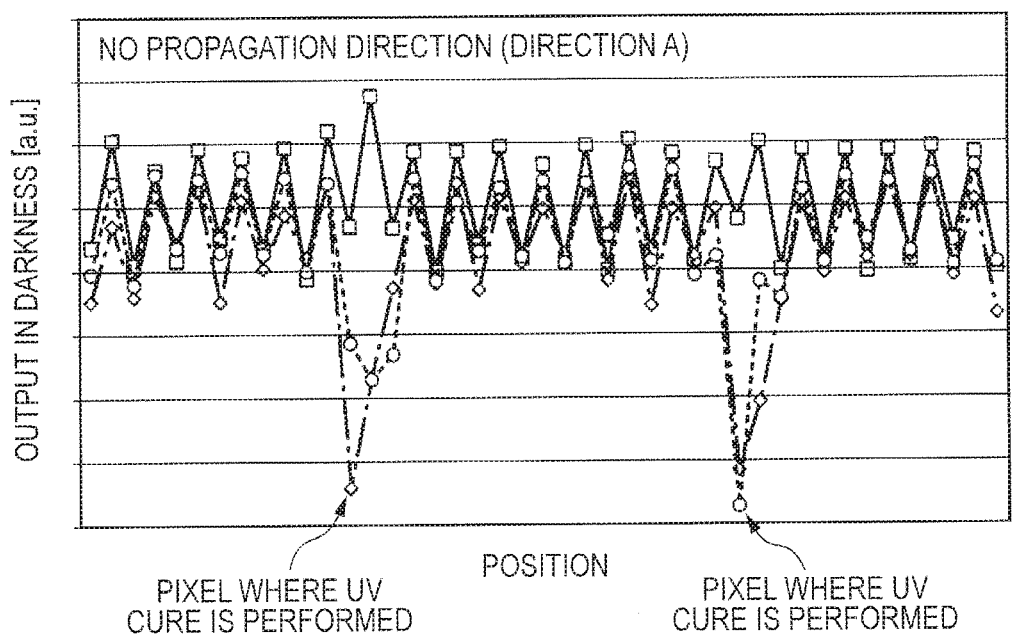
FIG. 17 is a diagram showing a result of dark characteristics in a region XVII in FIG. 16.
Figure 18:
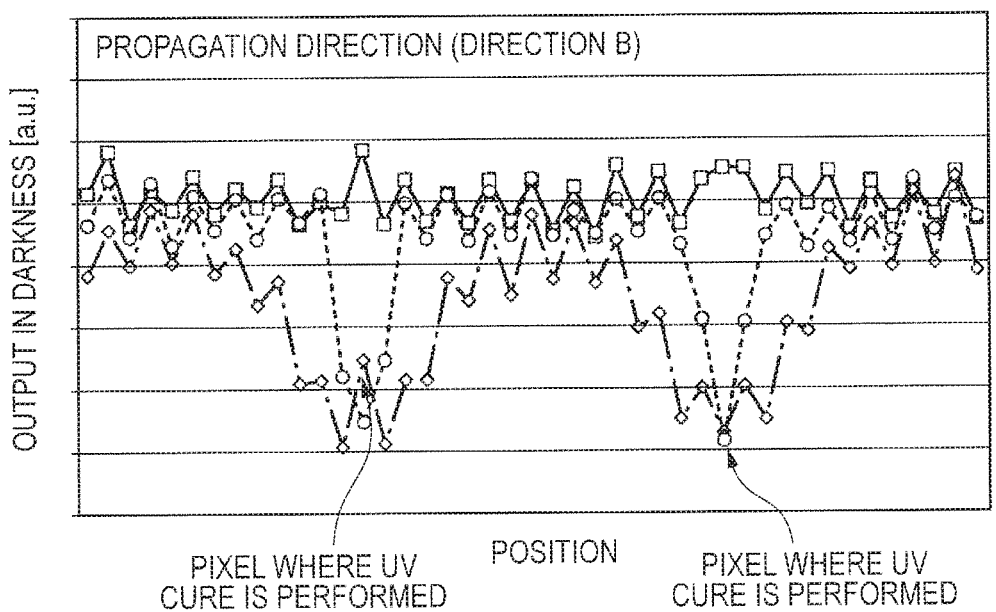
FIG. 18 is a diagram showing a result of dark characteristics in a region XVIII in FIG. 16.

In each of FIGS. 17 and 18, the solid line indicates the dark characteristics in a state in which the UV light is not irradiated, the dashed line indicates the dark characteristics in a state in which the UV light is irradiated, but subsequent heat treatment is not performed, and the dashed-dotted line indicates the dark characteristics in a state in which the UV light is irradiated, and thereafter heat treatment is performed (UV cure is performed).

As shown in FIG. 17, in a plurality of pixels PX arranged in a direction (the direction A) in which the antireflection films AR are separated from each other, it is known that output in darkness from only the pixels PX where the UV cure is performed is lowered. In other words, the dark current is lowered in only the pixels PX where the UV cure is performed.

On the other hand, as shown in FIG. 18, in a plurality of pixels PX arranged in a direction (the direction B) in which the antireflection films AR are coupled with each other, it is known that output in darkness from not only the pixels PX where the UV cure is performed, but also the pixels PX around the pixels PX where the UV cure is performed is lowered. In other words, the dark current is lowered in the pixels PX where the UV cure is performed and the pixels PX around the pixels PX where the UV cure is performed is lowered.

It is known that the result of FIG. 18 can be obtained when at least a layer including silicon nitride in the antireflection film AR is coupled in each pixel PX.

From the results described above, it is known that at least a layer including silicon nitride in the antireflection film AR in each pixel PX is coupled in each pixel PX, so that the dark characteristics are improved and the dark current can be reduced not only in the pixels PX where the UV cure is performed, but also in the pixels PX around the pixels PX where the UV cure is performed.

Next, functional effects of the present embodiment will be described.

As shown in FIG. 5, in the present embodiment, the insulating layer SL2 including silicon nitride in the effective pixel EPX and the insulating layer SL2 including silicon nitride in the OB pixel OBPX are coupled with each other. Therefore, when the UV light is irradiated to the pixel EPX in the effective pixel region EPR in the process shown in FIG. 14, it is possible to reduce the dark current not only in the pixel EPX, but also in the pixel OBPX in the OB pixel region OBR, whose insulating layer SL2 is coupled to the insulating layer SL2 of the pixel EPX.

In this way, it is possible to reduce the dark current of the OB pixel OBPX by using an existing antireflection film, so that it is not necessary to provide a new layer to reduce the dark current of the OB pixel OBPX. Therefore, the process to form the hydrogen diffusion preventing film, which is required in the method of related art, is not required, so that manufacturing process becomes simple.

Further, in the present embodiment, the insulating layer SL2 is formed of a single layer of a silicon nitride layer. Therefore, as described above, a propagation effect of the UV cure is obtained due to the silicon nitride layer, so that it is possible to reduce the dark current also in the OB pixel OBPX where the UV light is not irradiate during the UV cure.

Further, in the present embodiment, the insulating layer SL1 in the effective pixel EPS and the insulating layer SL1 in the OB pixel OBPX are coupled with each other and are formed of the same layer. Therefore, as shown in FIG. 12, it is possible to pattern the insulating layer SL1 and the insulating layer SL2 by using the photoresist PR1 as a mask.

Further, in the present embodiment, the light blocking layer LBL is formed, so that it is possible to light-block the OB pixel OBPX in the OB pixel region OBR. Thereby, it is possible to output a pixel signal independent of incident light from the OB pixel OBPX.

The UV cure is performed after the light blocking layer LBL is formed, so that the OB pixel OBPX is not irradiated with the UV light. However, the insulating layer SL2 in the OB pixel OBPX and the insulating layer SL2 in the effective pixel EPX are coupled with each other. Therefore, when the UV light is irradiated to the pixel EPX in the effective pixel region EPR in the process shown in FIG. 14, it is possible to reduce the dark current not only in the pixel EPX, but also in the pixel OBPX in the OB pixel region OBR, whose insulating layer SL2 is coupled to the insulating layer SL2 of the pixel EPX.

Second Embodiment

Figure 19:
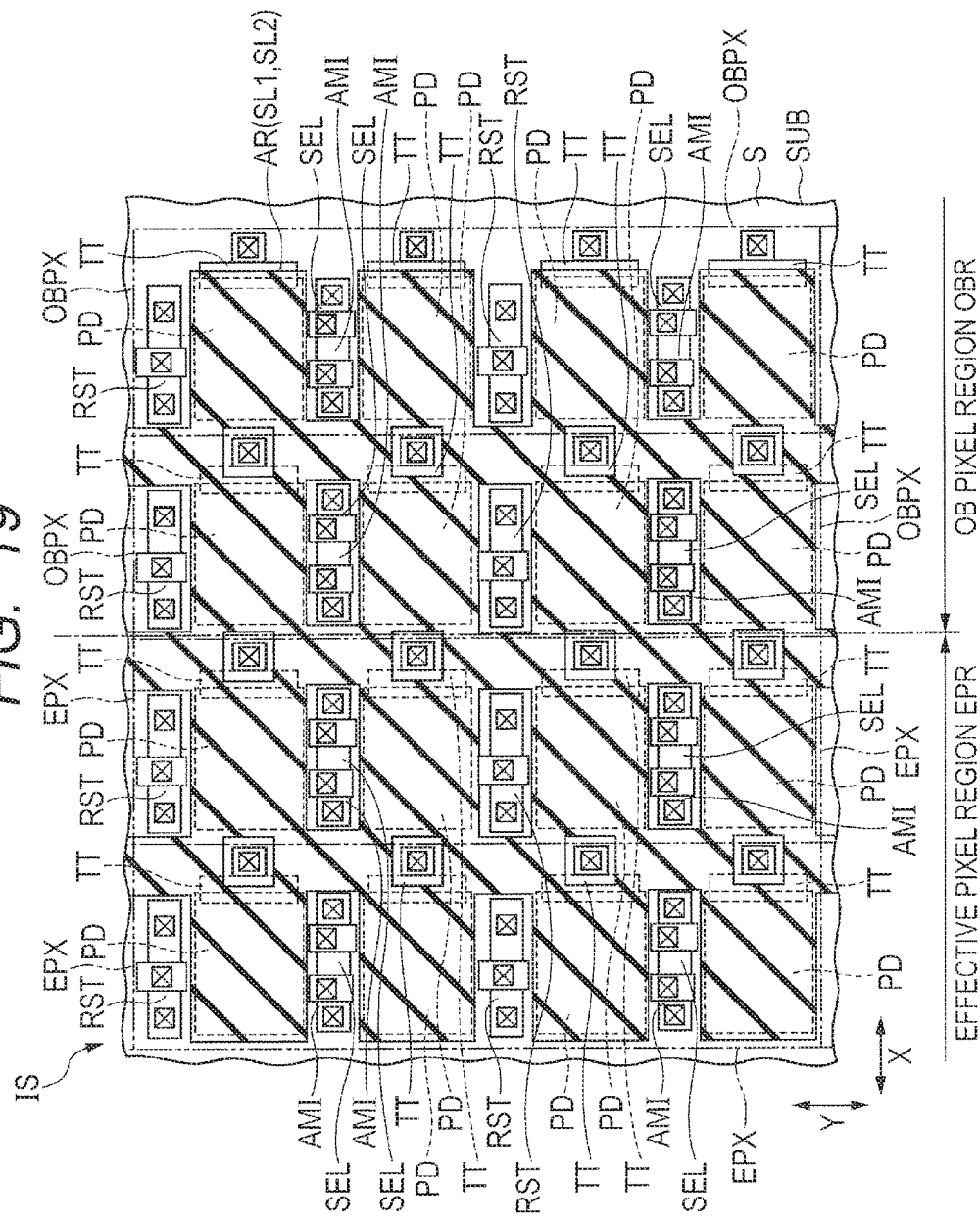
FIG. 19 is an enlarged schematic plan view showing a part of configuration in a pixel region in an imaging device according to a second embodiment.
Figure 20:
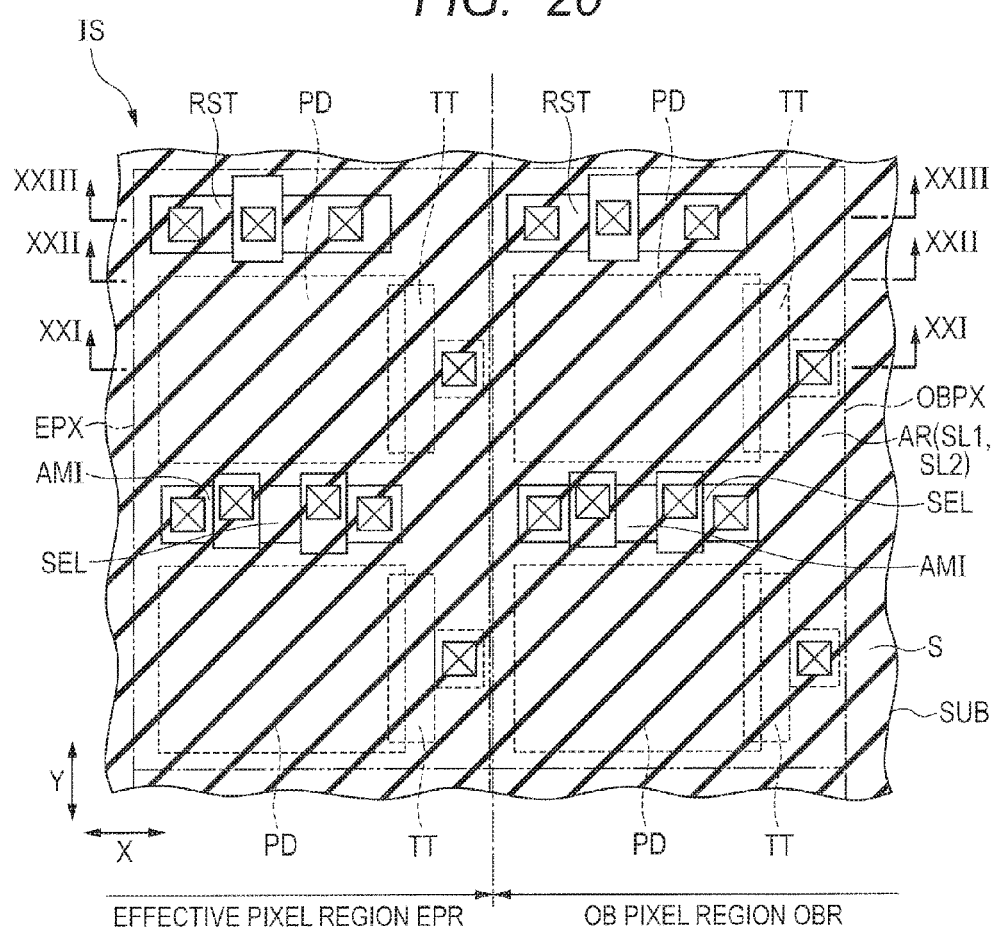
FIG. 20 is an enlarged schematic plan view showing a part of configuration in a pixel region in an imaging device according to a third embodiment.

As shown in FIG. 19, the configuration of the present embodiment is different from that of the first embodiment in the configuration of the antireflection film AR.

In the present embodiment, the antireflection film AR of each of a plurality of OB pixels OBPX arranged in the X direction in plan view is coupled with each other. The antireflection film AR of each of a plurality of effective pixels EPX arranged in the X direction in plan view is coupled with each other.

The antireflection film AR of each of a plurality of OB pixels OBPX arranged in the Y direction in plan view is coupled with each other. The antireflection film AR of each of a plurality of effective pixels EPX arranged in the Y direction in plan view is coupled with each other. The above configuration will be specifically described below.

Specifically, one OB pixel OBPX (first optical black pixel) and one effective pixel EPX (first effective pixel) are arranged adjacent to each other in the X direction in FIG. 19. The antireflection film AR located immediately above a photodiode PD (first light receiving portion) of the one OB pixel OBPX and the antireflection film AR located immediately above a photodiode PD (second light receiving portion) of the one effective pixel EPX are coupled with each other and are formed of the same film.

The antireflection film AR located immediately above a photodiode (third light receiving portion) of another OB pixel OBPX (second optical black pixel) adjacent to the one OB pixel OBPX and the antireflection film AR located immediately above the photodiode PD (the first light receiving portion) of the one OB pixel OBPX are coupled with each other and are formed of the same film.

The anti reflection film AR of the other OB pixel OBPX includes an insulating layer SL1 (third insulating layer) and an insulating layer SL2 (third insulating layer portion). The insulating layer SL1 (the third insulating layer) is in contact with the main surface MSU of the semiconductor substrate SUB over the photodiode (the third light receiving portion) and is formed of a material including silicon icon oxide. The insulating layer SL2 (the third insulating layer portion) is in contact with the insulating layer SL1 (the third insulating layer) over the photodiode (the third light receiving portion) and is formed of a material including silicon nitride.

The insulating layer SL1 (the third insulating layer) is coupled with the insulating layer SL1 (first insulating layer) located immediately above the photodiode PD (the first light receiving portion) of the one OB pixel OBPX and the insulating layer SL1 (second insulating layer) located immediately above the photodiode PD (the second light receiving portion) of the one effective pixel EPX and is formed of the same layer.

Further, the insulating layer SL2 (the third insulating layer portion) is coupled with the insulating layer SL2 (first insulating layer portion) located immediately above the photodiode PD (the first light receiving portion) of the one OB pixel OBPX and the insulating layer SL2 (second insulating layer portion) located immediately above the photodiode PD (the second light receiving portion) of the one effective pixel EPX and is formed of the same layer.

The other OB pixel OBPX may be arranged adjacent to the one OB pixel OBPX along a direction (the X direction) in which the one OB pixel OBPX and the one effective pixel EPX are aligned in plan view.

Further, the other OB pixel OBPX may be arranged adjacent to the one GB pixel OBPX along a direction (the Y direction) crossing (for example, perpendicular to) the direction (the X direction) in which the one OB pixel OBPX and the one effective pixel EPX are aligned in plan view.

The antireflection film AR located immediately above a photodiode PD (fourth light receiving portion) of another effective pixel EPX (second effective pixel) adjacent to the one effective pixel EPX and the antireflection film AR located immediately above the photodiode PD (the second light receiving portion) of the one effective pixel EPX are coupled with each other and are formed of the same film.

The antireflection film AR of the other effective pixel EPX includes an insulating layer SL1 (fourth insulating layer) and an insulating layer SL2 (fourth insulating layer portion). The insulating layer SL1 (the fourth insulating layer) is in contact with the main surface MSU of the semiconductor substrate SUB over the photodiode (the fourth light receiving portion) and is formed of a material including silicon oxide. The insulating layer SL2 (the fourth insulating layer portion) is in contact with the insulating layer SL1 (the fourth insulating layer) over the photodiode (the fourth light receiving portion) and is formed of a material including silicon nitride.

The insulating layer SL1 (the fourth insulating layer) is coupled with the insulating layer SL1 (the first insulating layer) located immediately above the photodiode PD (the first light receiving portion) of the one OB pixel OBPX and the insulating layer SL1 (the second insulating layer) located immediately above the photodiode PD (the second light receiving portion) of the one effective pixel EPX and is formed of the same layer. Further, the insulating layer SL1 (the fourth insulating layer) is coupled with the insulating layer SL1 (the third insulating layer) located immediately above the photodiode PD (the third light receiving portion) of the other OB pixel OBPX and is formed of the same layer.

Further, the insulating layer SL2 (the fourth insulating layer portion) is coupled with the insulating layer SL2 (the first insulating layer portion) located immediately above the photodiode PD (the first light receiving portion) of the one OB pixel OBPX and the insulating layer SL2 (the second insulating layer portion) located immediately above the photodiode PD (the second light receiving portion) of the one effective pixel EPX and is formed of the same layer. Further, the insulating layer SL2 (the fourth insulating layer portion) is coupled with the insulating layer SL2 (the third insulating layer portion) located immediately above the photodiode PD (the third light receiving portion) of the other OB pixel OBPX and is formed of the same layer.

The other effective pixel EPX may be arranged adjacent to the one effective pixel EPX along a direction (the X direction) in which the one OB pixel OBPX and the one effective pixel EPX are aligned in plan view.

Further, the other effective pixel EPX may be arranged adjacent to the one effective pixel EPX along a direction (the Y direction) crossing (for example, perpendicular to) the direction (the X direction) in which the one OB pixel OBPX and the one effective pixel EPX are aligned in plan view.

The configuration of the present embodiment other than that described above is substantially the same as that of the first embodiment shown in FIGS. 1 to 8, so that the same components are denoted by the same symbols and the repeated description will be omitted.

According to the present embodiment, the antireflection films AR of a plurality of OB pixels OBPX arranged in the X direction are coupled with each other and the antireflection films AR of a plurality of effective pixels EPX arranged in the X direction are coupled with each other, so that it is possible to equalize the dark characteristics over the entire pixel array PXA.

Third Embodiment

As shown in FIGS. 20 to 23, the configuration of the present embodiment is different from that of the first embodiment in a point that the antireflection film AR is arranged over the entire pixel array PXA. However, the antireflection film AR is removed in a portion where a contact hole penetrates the antireflection film AR. The contact hole is a contact hole that reaches the main surface MSU of the semiconductor substrate SUB, the gate electrode layer GT, and the like.

Therefore, the antireflection film AR covers over the entire GB pixel OBPX and over the entire effective pixel EPX. The insulating layer SL1 is located over the entire pixel array PXA except for a portion of the contact hole. The insulating layer SL2 is in contact with the insulating layer SL1 over the entire pixel array PXA except for the portion of the contact hole.

Thereby the antireflection films AR over the photodiodes PD of all the pixels in the pixel array PXA are coupled with each other and are formed of the same film. In other words, the insulating layers SL1 located over the photodiodes PD of all the pixels in the pixel array PXA are coupled with each other and are formed of the same film. Further, the insulating layers SL2 located over the photodiodes PD of all the pixels in the pixel array PXA are coupled with each other and are formed of the same film.

Figure 21:
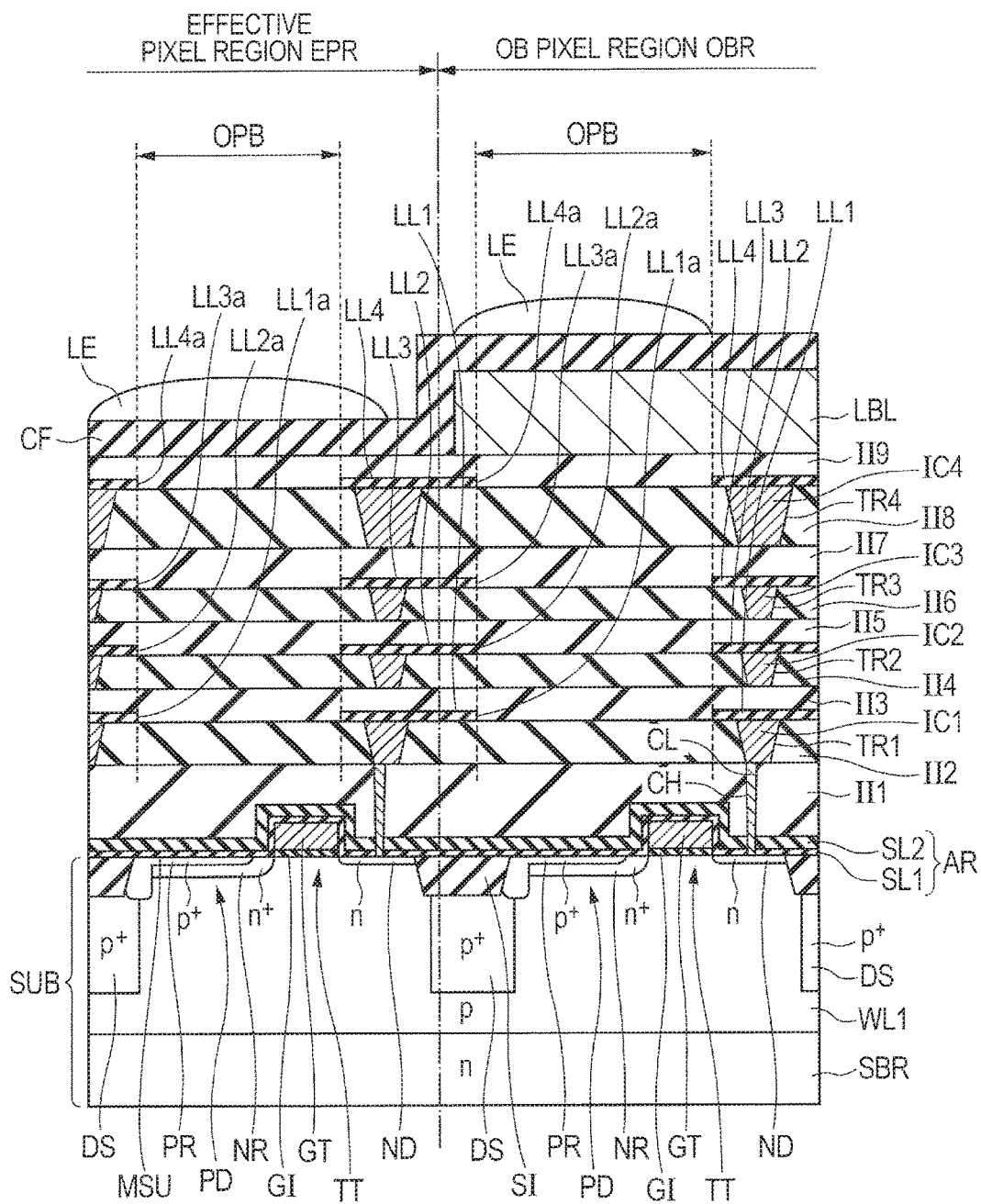
FIG. 21 is a schematic cross-sectional view taken along line XXI-XXI in FIG. 20.
Figure 22:
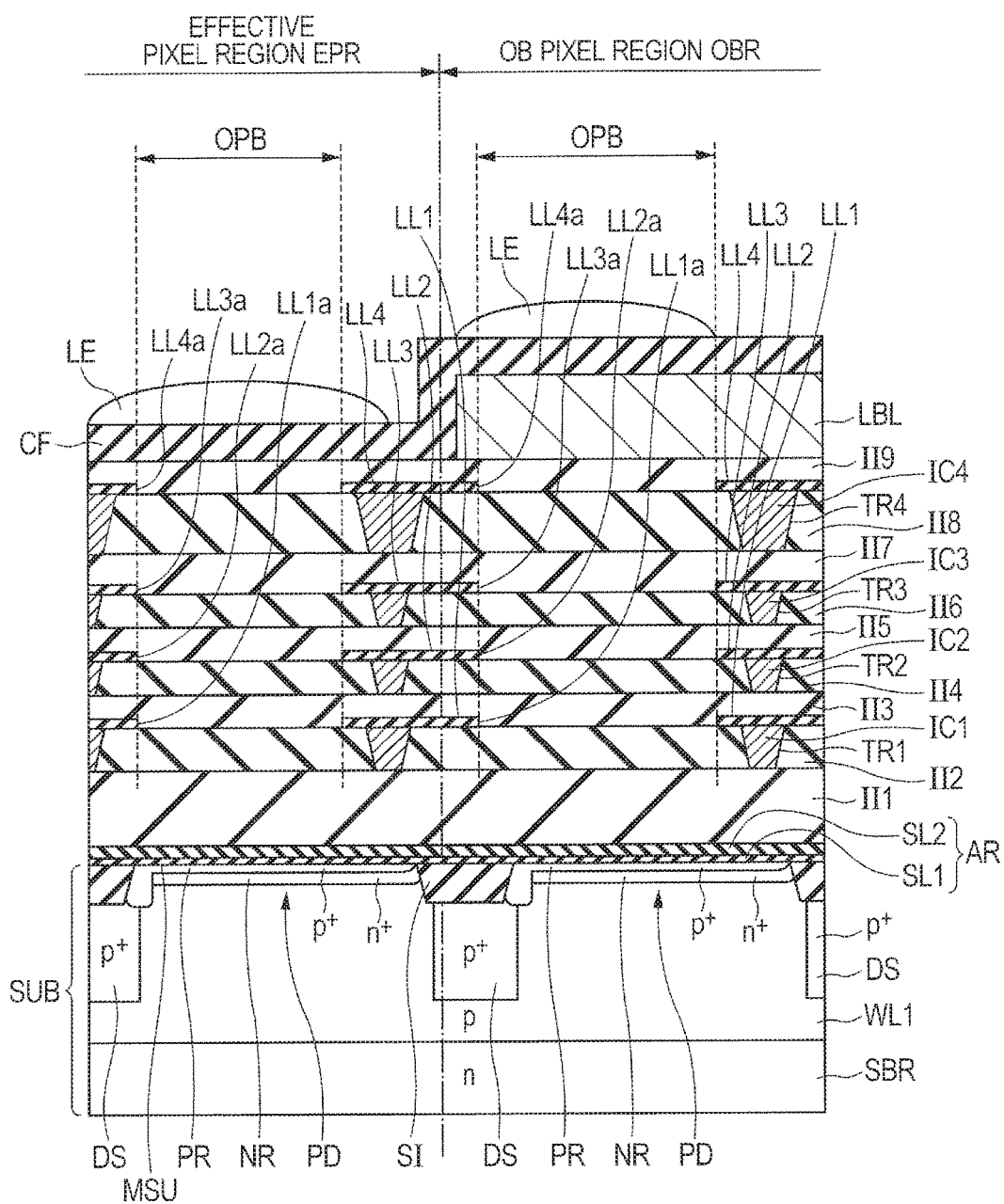
FIG. 22 is a schematic cross-sectional view taken along line XXII-XXII in FIG. 20.
Figure 23:
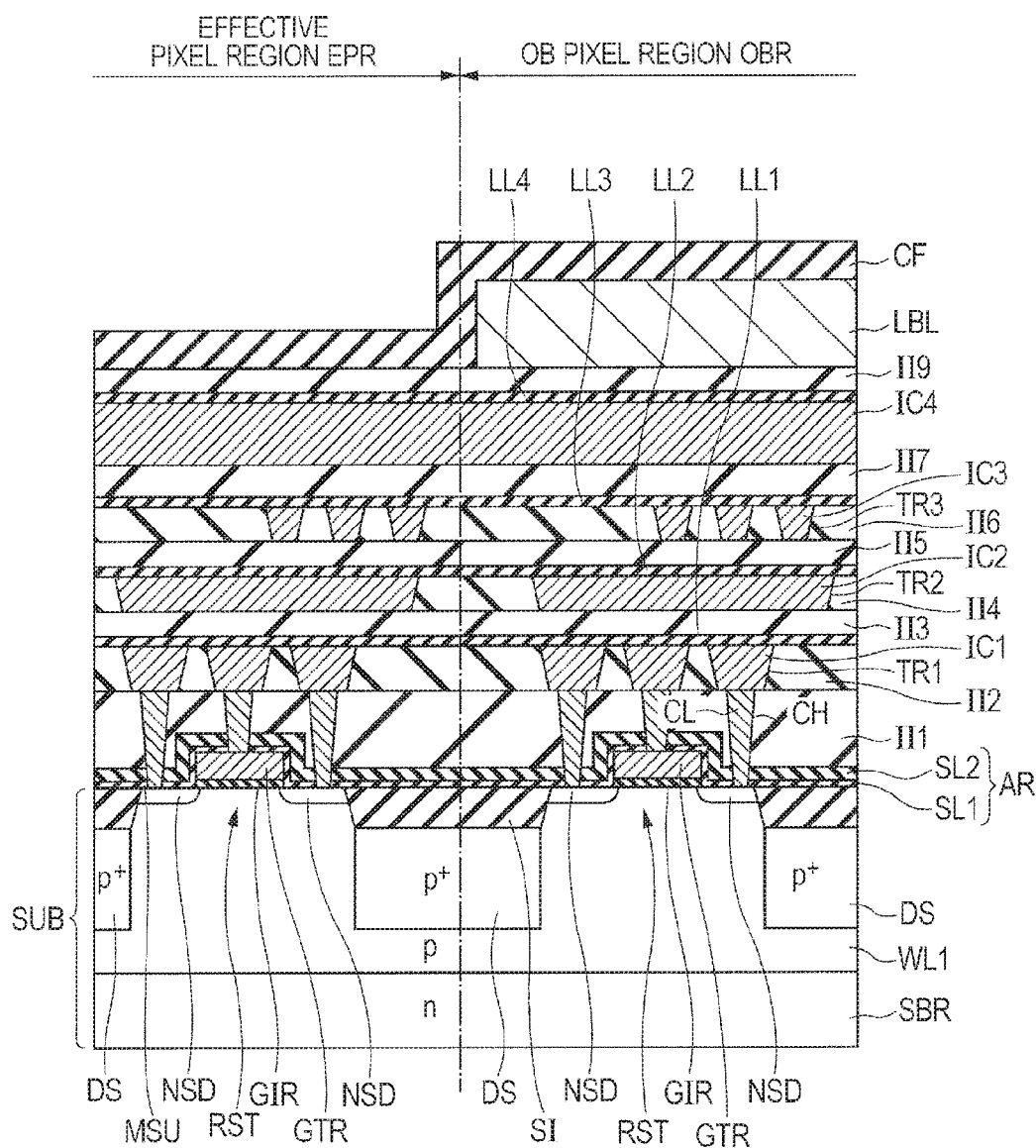
FIG. 23 is a schematic cross-sectional view taken along line XXIII-XXIII in FIG. 20.

In the present embodiment, as shown in FIGS. 21 and 23, the source/drain regions of each of the transistors TT, RST, AMI, and SEL included in a pixel do not have an LDD structure, but are formed of a single region of n-type impurity region.

The configuration of the present embodiment other than that described above is substantially the same as that of the first embodiment shown in FIGS. 1 to 8, so that the same components are denoted by the same symbols and the repeated description will be omitted.

First, the manufacturing method of the present embodiment has the same process as that of the first embodiment shown in FIGS. 9 to 11. Thereafter, the manufacturing method of the present embodiment has the same post-process as that of the first embodiment without the antireflection film AR being patterned. Thereby, the imaging device of the present embodiment shown in FIGS. 20 to 23 is manufactured.

According to the present embodiment, it is not necessary to pattern the antireflection films AR in the pixel array PXA. Therefore, the configuration of the mask used to pattern the antireflection films AR can be simplified, so that the mask is easily designed.

Further, according to the present embodiment, the antireflection films AR located over the photodiodes PD of all the pixels in the pixel array PXA are coupled with each other, so that it is possible to equalize the dark characteristics over the entire pixel array PXA.

Others

Figure 24:
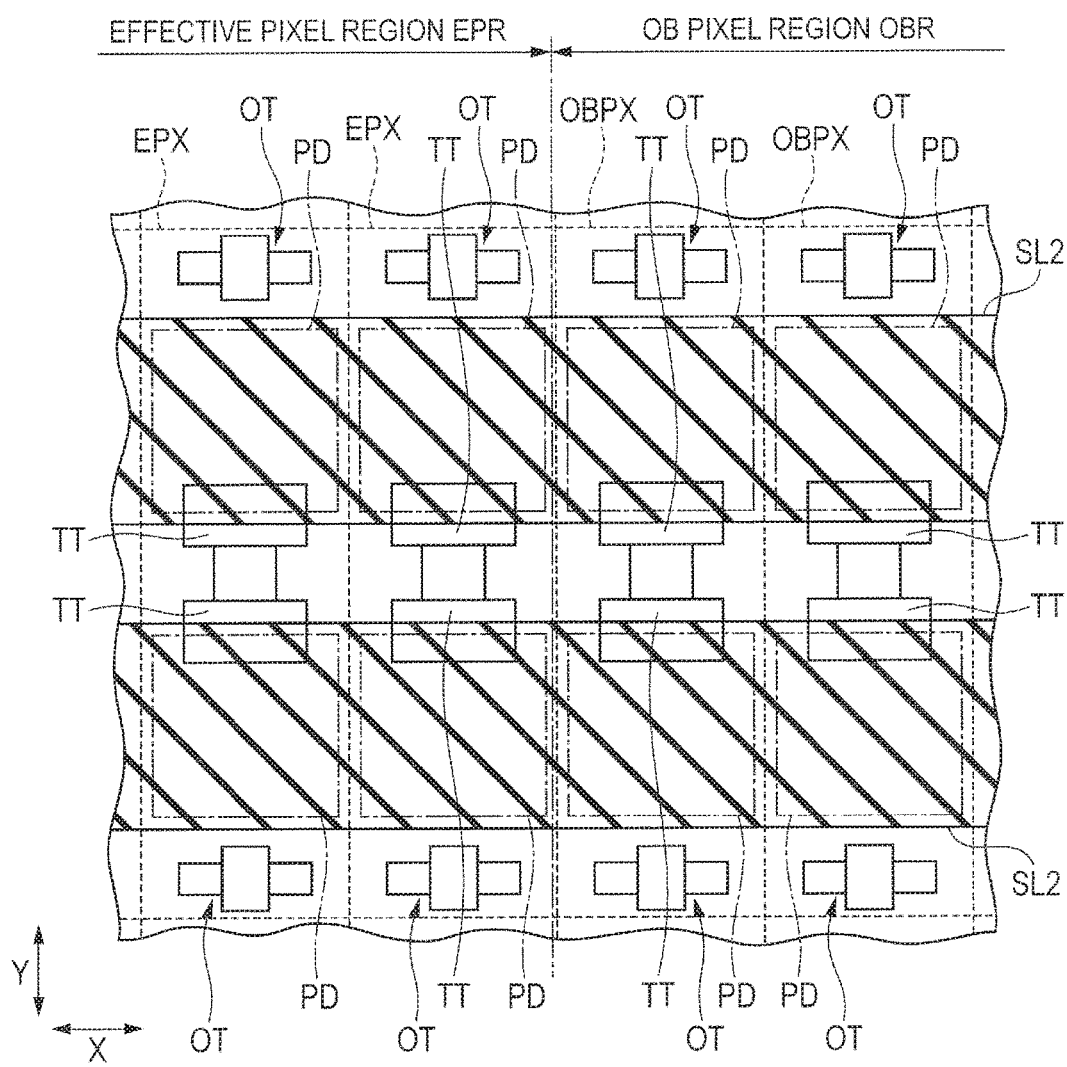
FIG. 24 is a plan view showing another first example of an arrangement of effective pixels and OB pixels.

As shown in FIG. 24, the transfer transistor TT is arranged on one side of opposite sides of the rectangular photodiode PD in plan view and another transistor OT (the reset transistor RST, the amplification transistor AMI, or the selection transistor SEL) may be arranged on the other side.

In this configuration, the transfer transistor IT is arranged between two photodiodes that form one pixel in plan view. On the other hand, the other transistor OT is arranged so as to sandwich the photodiode PD with the transfer transistor TT.

In a plurality of pixels OBPX and EPX arranged in the X direction in FIG. 24, each of the transfer transistors TT may be arranged on the same side with respect to the photodiode PD. Specifically, in the pixels OBPX and EPX arranged in the X direction in FIG. 24, each of the transfer transistors TT is arranged between two photodiodes PD that form one pixel.

Further, in the pixels OBPX and EPX arranged in the X direction in FIG. 24, each of the other transistors OT may be arranged on the same side with respect to the photodiode PD.

Figure 25:
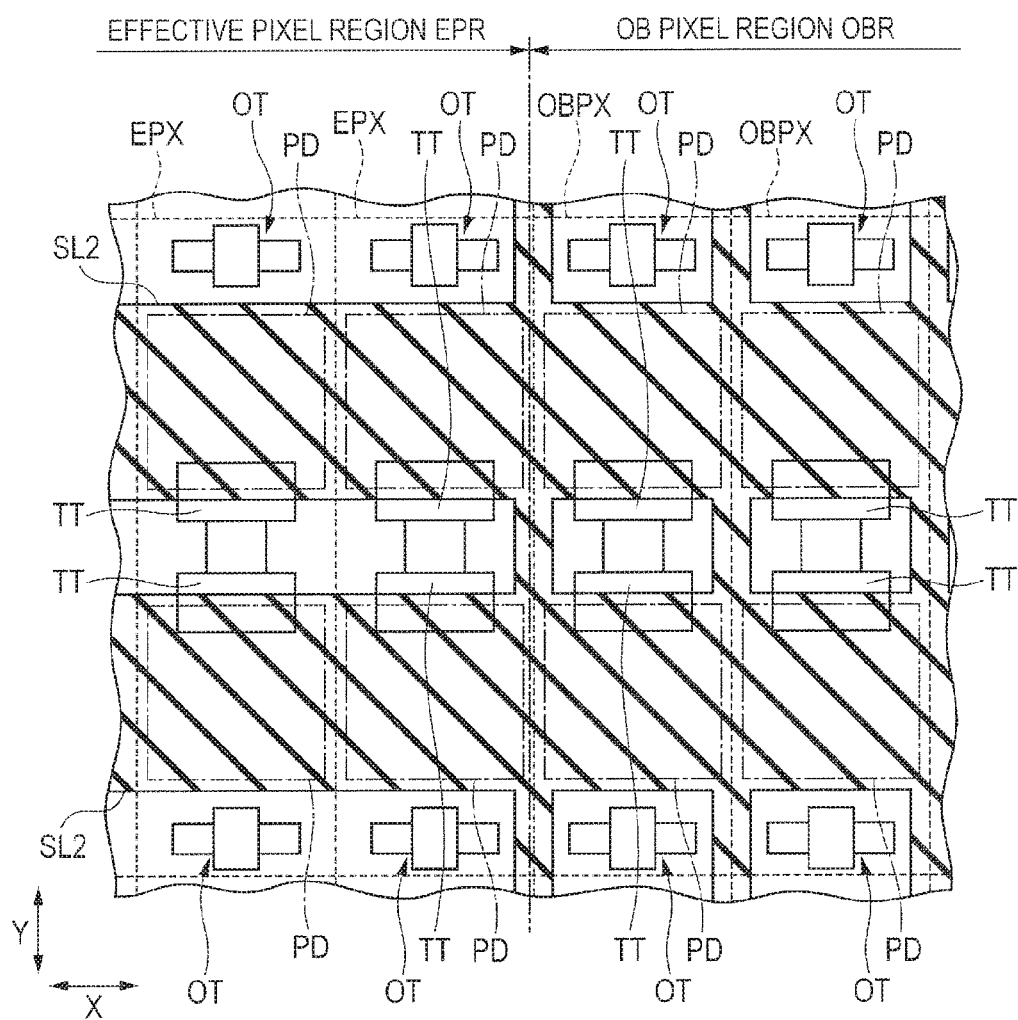
FIG. 25 is a plan view showing another second example of an arrangement of effective pixels and OB pixels.

As shown in FIG. 25, in the configuration of FIG. 24, the antireflection films AR of the OB pixels OBPX arranged in the Y direction in the drawings may be coupled with each other.

Figure 26:
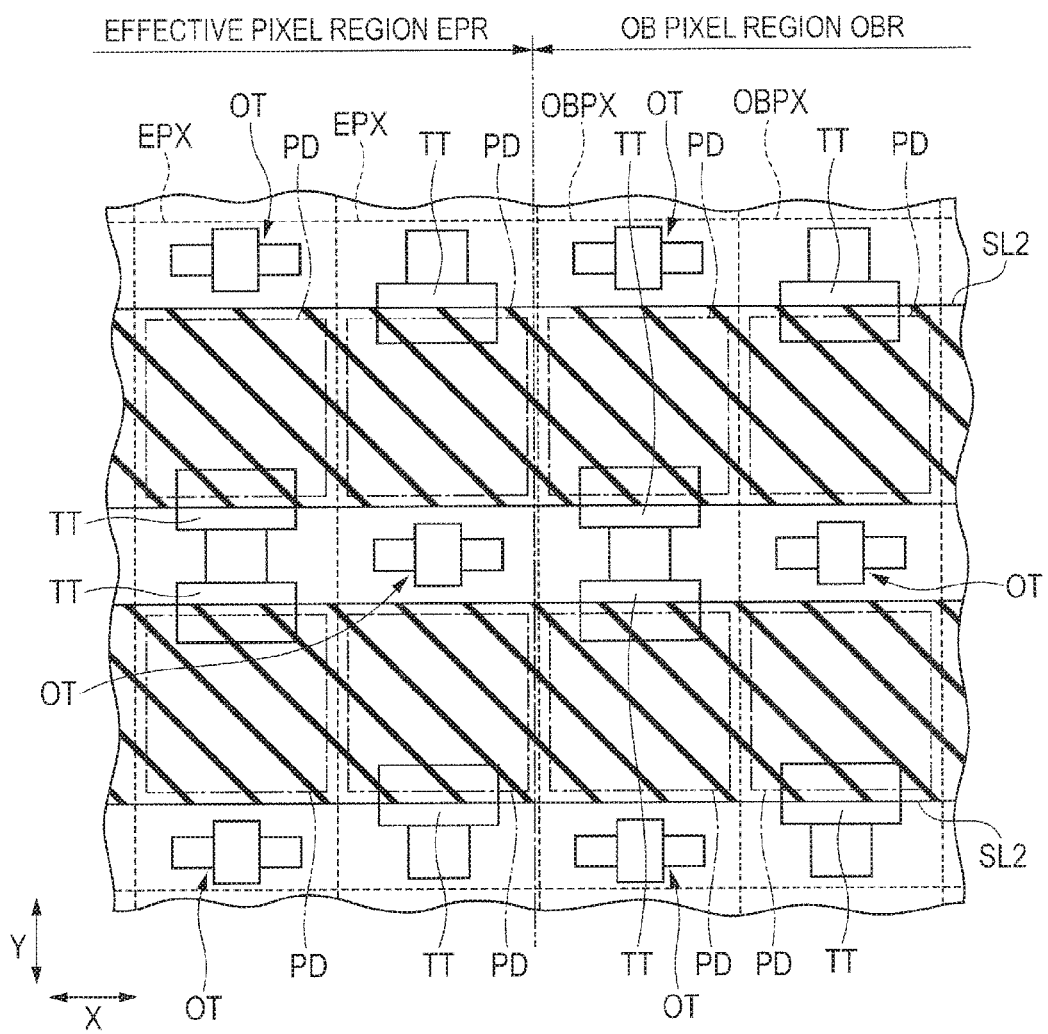
FIG. 26 is a plan view showing another third example of an arrangement of effective pixels and OB pixels.

As shown in FIG. 26, the transfer transistor TT is arranged on one side of opposite sides of the rectangular photodiode PD in plan view and another transistor OT (the reset transistor RST, the amplification transistor AMI, or the selection transistor SEL) may be arranged on the other side.

In a plurality of pixels OBPX and EPX arranged in the X direction in FIG. 26, each of the transfer transistors TT may be arranged alternately on the opposite side for each pixel with respect to the photodiode PD. Specifically, when in a certain pixel, the transfer transistor TT is arranged between two photodiodes PD that form one pixel, in another pixel adjacent to the certain pixel in the X direction, another transistor OT may be arranged between two photodiodes PD that form one pixel.

Figure 27:
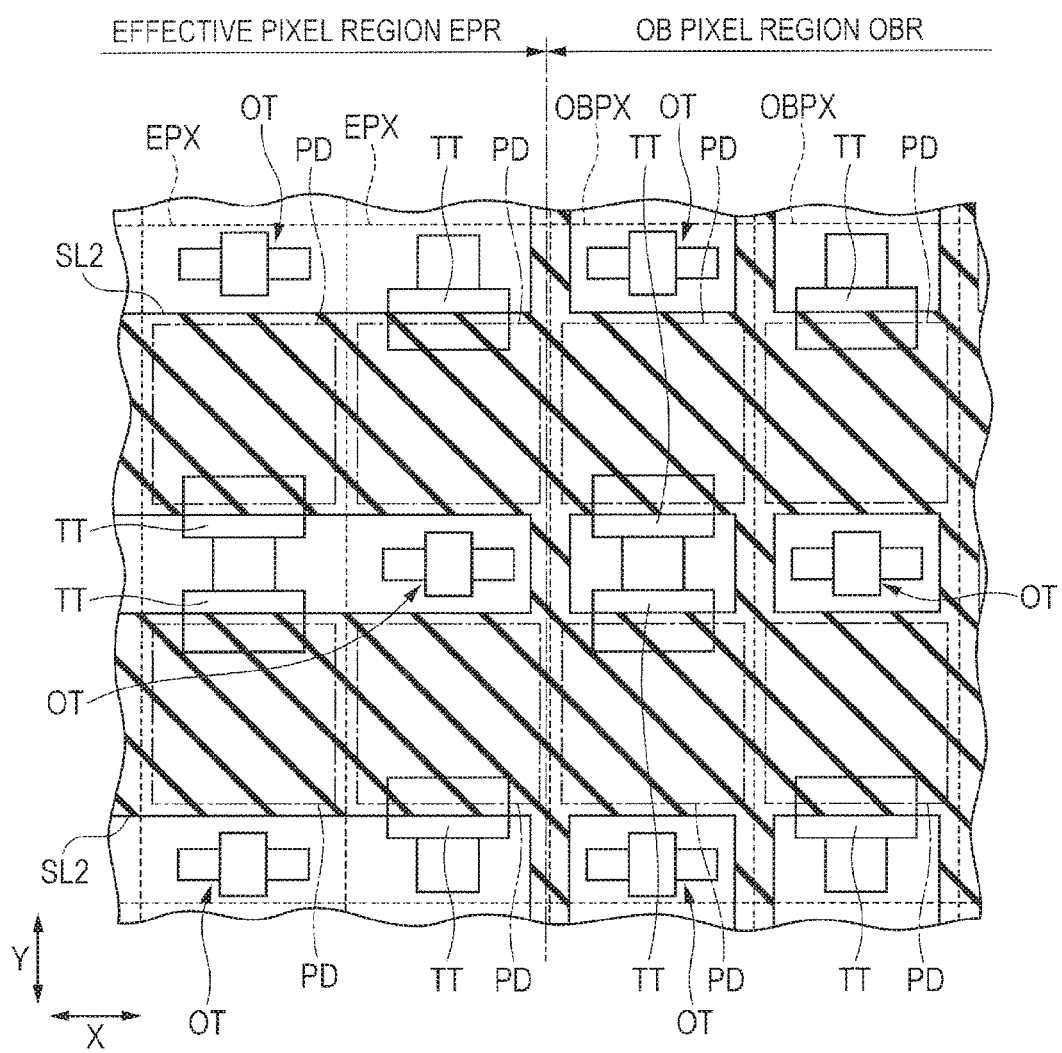
FIG. 27 is a plan view showing another fourth example of an arrangement of effective pixels and OB pixels.

As shown in FIG. 27, in the configuration of FIG. 26, the antireflection films AR of the OB pixels OBPX arranged in the Y direction in the drawings may be coupled with each other.

The insulating layer SL2 described above is not limited to silicon nitride, but may be a material including silicon nitride such as silicon carbon nitride and silicon oxynitride.

In the embodiments described above, a configuration is described in which one pixel includes two photodiodes. However, one pixel may include only one photodiode or may include three or more photodiodes.

While the invention made by the inventors has been specifically described based on the embodiments, it is needless to say that the present invention is not limited to the embodiments and may be variously modified without departing from the scope of the invention.

What is claimed is:

1. An imaging device including an effective pixel region and an optical black pixel region, the imaging device comprising:
   a semiconductor substrate including a main surface;
   a first optical black pixel which is arranged in the optical black pixel region and includes a first light receiving portion formed in the semiconductor substrate;
   a first effective pixel which is arranged in the effective pixel region and includes a second light receiving portion formed in the semiconductor substrate;
   a first insulating layer which is in contact with the main surface of the semiconductor substrate over the first light receiving portion and includes silicon oxide;
   a second insulating layer which is in contact with the main surface of the semiconductor substrate over the second light receiving portion and includes silicon oxide;
   a first insulating layer portion which is in contact with the first insulating layer over the first light receiving portion and includes silicon nitride;
   a second insulating layer portion which is in contact with the second insulating layer over the first light receiving portion and includes silicon nitride;
   a second optical black pixel which is arranged adjacent to the first optical black pixel and includes a third light receiving portion formed in the semiconductor substrate;
   a third insulating layer which is in contact with the main surface of the semiconductor substrate over the third light receiving portion and includes silicon oxide;
   third insulating layer portion which is in contact with the third insulating layer over the third light receiving portion and includes silicon nitride,
   wherein the first insulating layer portion and the second insulating layer portion are coupled with each other and are formed of the same layer, and
   wherein the third insulating layer portion is coupled with the first insulating layer portion and the second insulating layer portion and is formed of the same coating layer as the first insulating layer portion and the second insulating layer portion.

2. The imaging device according to claim 1, wherein the first insulating layer portion and the second insulating layer portion are formed of a single layer of a silicon nitride layer.

3. The imaging device according to claim 1, wherein the first insulating layer and the second insulating layer are coupled with each other and are formed of the same layer.

4. The imaging device according to claim 1, wherein the second optical black pixel is arranged adjacent to the first optical black pixel along a direction in which the first optical black pixel and the first effective pixel are aligned in plan view.

5. The imaging device according to claim 1, wherein the second optical black pixel is arranged adjacent to the first optical black pixel along a direction crossing a direction in which the first optical black pixel and the first effective pixel are aligned in plan view.

6. The imaging device according to claim 1, further comprising:
   a second effective pixel which is arranged adjacent to the first effective pixel and includes a fourth light receiving portion formed in the semiconductor substrate;
   a fourth insulating layer which is in contact with the main surface of the semiconductor substrate over the fourth light receiving portion and includes silicon oxide; and
   a fourth insulating layer portion which is in contact with the fourth insulating layer over the fourth light receiving portion and includes silicon nitride,
   wherein the fourth insulating layer portion is coupled with the first insulating layer portion, the second insulating layer portion, and the third insulating layer portion and is formed of the same layer as the first insulating layer portion, the second insulating layer portion, and the third insulating layer portion.

7. The imaging device according to claim 6,
   wherein the second effective pixel is arranged adjacent to the first effective pixel along a direction in which the first optical black pixel and the first effective pixel are aligned in plan view.

8. The imaging device according to claim 6,
   wherein the second effective pixel is arranged adjacent to the first effective pixel along a direction crossing a direction in which the first optical black pixel and the first effective pixel are aligned in plan view.

9. The imaging device according to claim 1,
   wherein the layer that forms the first insulating layer portion and the second insulating layer portion covers the entire first optical black pixel and the entire first effective pixel.

10. A manufacturing method of an imaging device including an effective pixel region and an optical black pixel region, the manufacturing method comprising the steps of:
    preparing a semiconductor substrate including a main surface;
    forming a first light receiving portion in the semiconductor substrate in the optical black pixel region and forming a second light receiving portion in the semiconductor substrate in the effective pixel region;
    forming a first insulating layer which is in contact with the main surface of the semiconductor substrate over the first light receiving portion and includes silicon oxide and forming a second insulating layer which is in contact with the main surface of the semiconductor substrate over the second light receiving portion and includes silicon oxide;
    forming a first insulating layer portion which is in contact with the first insulating layer over the first light receiving portion and includes silicon nitride and a second insulating layer portion which is in contact with the second insulating layer over the second light receiving portion and includes silicon nitride from the same coating layer so as to be coupled with each other; and
    irradiating at least a part of the coating layer with ultraviolet light.

11. The manufacturing method of an imaging device according to claim 10, further comprising the step of:
    after the step of forming the coating layer and before the step of irradiating with ultraviolet light, forming a light blocking layer that covers the optical black pixel region and exposes the effective pixel region,
    wherein in the step of irradiating with ultraviolet light, the ultraviolet light is irradiated through the light blocking layer.

* * * * *